US012217793B2

(12) United States Patent
Song et al.

(10) Patent No.: US 12,217,793 B2
(45) Date of Patent: Feb. 4, 2025

(54) DATA TRANSFER CIRCUITS IN NONVOLATILE MEMORY DEVICES AND NONVOLATILE MEMORY DEVICES INCLUDING THE SAME

(71) Applicant: SAMSUNG ELECTRONICS CO., LTD., Suwon-si (KR)

(72) Inventors: Eunjin Song, Suwon-si (KR); Kyoungtae Kang, Seoul (KR); Sanglok Kim, Seoul (KR); Chiweon Yoon, Seoul (KR); Byunghoon Jeong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 228 days.

(21) Appl. No.: 17/852,035

(22) Filed: Jun. 28, 2022

(65) Prior Publication Data

US 2023/0154527 A1 May 18, 2023

(30) Foreign Application Priority Data

Nov. 16, 2021 (KR) .................. 10-2021-0157587
Jan. 11, 2022 (KR) .................. 10-2022-0003763

(51) Int. Cl.
*G11C 11/4096* (2006.01)
*G11C 11/4074* (2006.01)
*G11C 11/4093* (2006.01)
*G11C 11/4094* (2006.01)

(52) U.S. Cl.
CPC ...... *G11C 11/4096* (2013.01); *G11C 11/4074* (2013.01); *G11C 11/4093* (2013.01); *G11C 11/4094* (2013.01)

(58) Field of Classification Search
CPC ............ G11C 11/4096; G11C 11/4074; G11C 11/4093; G11C 11/4094
USPC ............................................. 365/17
See application file for complete search history.

(56) References Cited

U.S. PATENT DOCUMENTS

| 6,421,294 | B2 * | 7/2002 | Hidaka ............... G11C 11/4096 365/230.01 |
| 6,614,710 | B2 * | 9/2003 | Song .................... G11C 7/1006 365/230.06 |
| 8,018,247 | B2 | 9/2011 | Priel et al. |
| 9,812,178 | B2 | 11/2017 | Koyama |

(Continued)

FOREIGN PATENT DOCUMENTS

JP          20160143206 A      8/2016

*Primary Examiner* — Huan Hoang
*Assistant Examiner* — Daniel J King
(74) *Attorney, Agent, or Firm* — Fish & Richardson P.C.

(57) ABSTRACT

A data transfer circuit in a nonvolatile memory device includes first repeaters, second repeaters and signal lines. The signal lines connect the first repeaters and the second repeaters, and include a first group of signal lines and a second group of signal lines alternatingly arranged. The first repeaters include a first group of repeaters activated in a first operation mode and a second group of repeaters activated in a second operation mode. The second repeaters include a third group of repeaters activated in the first operation mode and are connected to the first group of repeaters through the first group of signal lines floated in the second operation mode, and a fourth group of repeaters activated in the second operation mode and are connected to the second group of repeaters through the second group of signal lines floated in the first operation mode.

20 Claims, 21 Drawing Sheets

(56) References Cited

U.S. PATENT DOCUMENTS

| | | |
|---|---|---|
| 9,886,997 B2 | 2/2018 | Kim et al. |
| 10,326,446 B2 | 6/2019 | Kim et al. |
| 10,530,341 B2 | 1/2020 | Kim et al. |
| 2016/0189759 A1* | 6/2016 | Kim .................. G11C 8/10 365/72 |
| 2017/0070225 A1 | 3/2017 | Kim et al. |
| 2017/0110197 A1* | 4/2017 | Park .................. G11C 7/12 |

* cited by examiner

DATA TRANSFER CIRCUITS IN NONVOLATILE MEMORY DEVICES AND NONVOLATILE MEMORY DEVICES INCLUDING THE SAME

CROSS-REFERENCE TO RELATED APPLICATIONS

This US application claims the benefit of priority under 35 USC § 119 to Korean Patent Application No. 10-2021-0157587, filed on Nov. 16, 2021 and to Korean Patent Application No. 10-2022-0003763, filed on Jan. 11, 2022, in the Korean Intellectual Property Office, the disclosures of each of which are incorporated by reference in their entirety herein.

BACKGROUND

1. Technical Field

Exemplary embodiments generally relate to semiconductor memory devices, and more particularly to data transfer circuits in nonvolatile memory devices and nonvolatile memory devices including the same.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, and the like.

Recently, nonvolatile memory devices of a three-dimensional structure such as a vertical NAND memory devices have been developed to increase an integration degree and memory capacity for the nonvolatile memory devices.

In a nonvolatile memory device, signal lines transferring data consume much power.

SUMMARY OF THE INVENTION

Some exemplary embodiments may provide a data transfer circuit in a nonvolatile memory device, capable of reducing power consumption.

Some exemplary embodiments may provide a nonvolatile memory device capable of reducing power consumption.

According to some exemplary embodiments, a data transfer circuit in a nonvolatile memory device includes a plurality of first repeaters, a plurality of second repeaters and a plurality of signal lines. The plurality of first repeaters are connected to a first circuit element disposed in a data input/output (I/O) path of the nonvolatile memory device. The plurality of second repeaters are connected to a second circuit element that is spaced apart from the first circuit element and is disposed in the data I/O path of the nonvolatile memory device. The plurality of signal lines connect the plurality of first repeaters and the plurality of second repeaters, and include a first group of signal lines and a second group of signal lines which are alternatingly arranged. The plurality of first repeaters include a first group of repeaters that are activated in a first operation mode and a second group of repeaters that are activated in a second operation mode having a non-overlapping operating interval with the first operation mode. The plurality of second repeaters include a third group of repeaters that are activated in the first operation mode and are connected to the first group of repeaters through the first group of signal lines, and a fourth group of repeaters that are activated in the second operation mode and are connected to the second group of repeaters through the second group of signal lines. The second group of signal lines are floated in the first operation mode and the first group of signal lines are floated in the second operation mode.

According to some exemplary embodiments, a nonvolatile memory device includes a memory cell array including a plurality of memory cells, a page buffer coupled to the memory cell array through a plurality of bit-lines, a data input/output (I/O) circuit a data transfer circuit and a control circuit. The data I/O circuit transmits/receives data to/from an external memory controller. The data transfer circuit is connected between the page buffer circuit and the data I/O circuit, provides the data from the data I/O circuit to the page buffer circuit in a first operation mode and provides the data from the page buffer circuit to the data I/O circuit in a second operation mode having a non-overlapping operating interval with the first operation mode. The control circuit controls the page buffer circuit and the data transfer circuit. The transfer circuit floats a portion of signal lines that do not transfer the data, from among a plurality of signal lines included therein, in response to a first power gating signal and a second power gating signal from the control circuit in each of the first operation mode and the second operation mode.

Accordingly, the page buffer circuit in the nonvolatile memory device includes a plurality of page buffer units and a plurality of cache latches. The plurality of cache latches are commonly connected to the plurality of page buffer units via a combined sensing node. While the page buffer circuit performs a first data output operation to output data provided from a first portion of page buffer units among the plurality of page buffer units, from a first portion of cache latches among the plurality of cache latches to a data input/output (I/O) line, the page buffer circuit is configured to perform a data transfer operation to dump sensed data from a second portion of page buffer units among the plurality of page buffer units to a second portion of cache latches among the plurality of cache latches. Therefore, the nonvolatile memory device may reduce an interval associated with a read operation.

According to some exemplary embodiments, a data transfer circuit in a nonvolatile memory device includes a plurality of first repeaters, a plurality of second repeaters and a plurality of signal lines. The plurality of first repeaters are connected to a first circuit element disposed in a data input/output (I/O) path of the nonvolatile memory device. The plurality of second repeaters are connected to a second circuit element that is spaced apart from the first circuit element and is disposed in the data I/O path of the nonvolatile memory device. The plurality of signal lines connect the plurality of first repeaters and the plurality of second repeaters, and include a first group of signal lines and a second group of signal lines which are alternatingly arranged. The plurality of first repeaters include a first group of repeaters that are activated in a first operation mode and a second group of repeaters that are activated in a second operation mode having a non-overlapping operating interval with the first operation mode. The plurality of second repeaters include a third group of repeaters that are activated in the first operation mode and are connected to the first group of repeaters through the first group of signal lines, and a fourth group of repeaters that are activated in the second operation mode and are connected to the second group of repeaters through the second group of signal lines. In the second operation mode, the first group of repeaters float an output node coupled to the first group of signal lines in response to a first power gating signal and in the first operation mode, the second group of repeaters are configured to float an output node coupled to the second group of signal lines in response to a second power gating signal.

Accordingly, the data transfer circuit and the nonvolatile memory device may transfer data to the page buffer circuit through the first group of signal lines while floating the second group of signal lines which are alternatingly arranged with the first group of signal lines using the second group of repeaters and the fourth group of repeaters in the first operation mode, may transfer data to the data I/O circuit through the second group of signal lines while floating the first group of signal lines using the first group of repeaters and the third group of repeaters in the second operation mode and may reduce power consumption by reducing capacitance of the signal lines transferring data.

BRIEF DESCRIPTION OF THE DRAWINGS

Illustrative, non-limiting exemplary embodiments will be more clearly understood from the following detailed description in conjunction with the accompanying drawings.

DETAILED DESCRIPTION OF THE PREFERRED EMBODIMENTS

Various exemplary embodiments will be described more fully hereinafter with reference to the accompanying drawings, in which some exemplary embodiments are shown.

Figure 1:
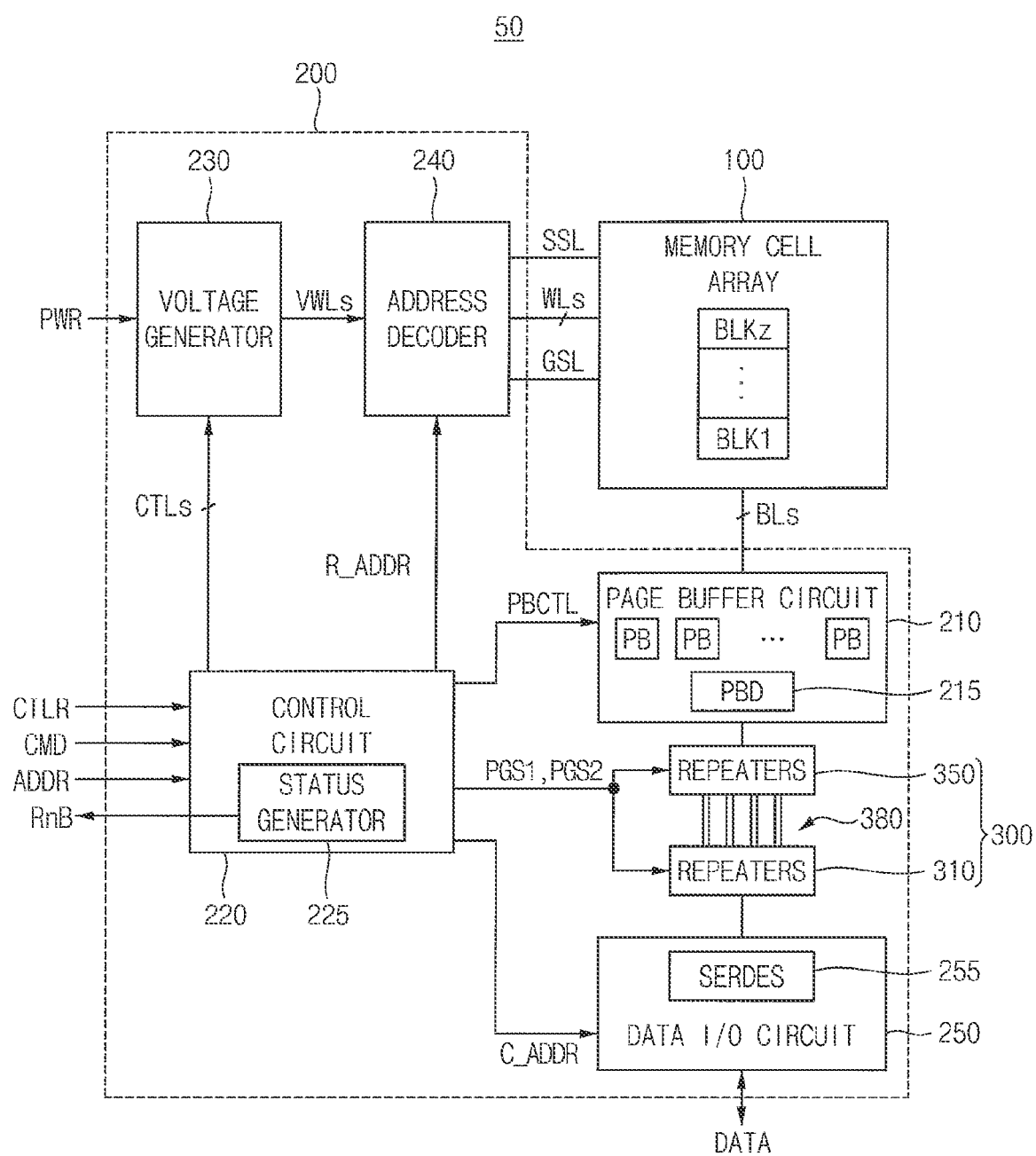
FIG. 1 is a block diagram of a nonvolatile memory device according to exemplary embodiments.

FIG. 1 is a block diagram of a nonvolatile memory device according to exemplary embodiments.

Referring to FIG. 1, a nonvolatile memory device 50 may include a memory cell array 100 and a peripheral circuit 200. The peripheral circuit 200 may include a page buffer circuit 210, a control circuit 220, a voltage generator 230, an address decoder 240, a data transfer circuit 300 and a data input/output (I/O) circuit 250. Although not illustrated in FIG. 1, the peripheral circuit 200 may further include an I/O interface, a column logic, a pre-decoder, a temperature sensor, etc.

The memory cell array 100 may be coupled to the address decoder 240 through a string selection line SSL, a plurality of word-lines WLs, and a ground selection line GSL. In addition, the memory cell array 100 may be coupled to the page buffer circuit 210 through a plurality of bit-lines BLs. The memory cell array 100 may include a plurality of nonvolatile memory cells coupled to the plurality of word-lines WLs and the plurality of bit-lines BLs.

The memory cell array 100 may include a plurality of memory blocks BLK1 through BLKz, and each of the memory blocks BLK1 through BLKz may have a three-dimensional (3D) structure. Here, z is an integer greater than two. The memory cell array 100 may include a plurality of vertical cell strings and each of the vertical cell strings includes a plurality of memory cells stacked with respect to each other.

The control circuit 220 may, receive a command CMD, an address ADDR, and a control signal CTRL from a memory controller (refer to 20 in FIG. 2) and may control an erase loop, a program loop and a read operation of the nonvolatile memory device 50.

In exemplary embodiments, the control circuit 220 may generate control signals CTLs, which are used for controlling the voltage generator 230, based on the command CMD, may generate a page buffer control signal PBCTL for controlling the page buffer circuit 210, may generate a first power gating signal PGS1 and a second power gating signal PSG2 for controlling the data transfer circuit 300 and may generate a row address R_ADDR and a column address C_ADDR based on the address ADDR. The control circuit 220 may provide the control signals CTLs to the voltage generator 230, may provide the page buffer control signal PBCTL to the page buffer circuit 210 and may provide the first power gating signal PGS1 and the second power gating signal PSG2 to the data transfer circuit 300.

In addition, the control circuit 220 may provide the row address R_ADDR to the address decoder 240 and provide the column address C_ADDR to the data I/O circuit 250. The control circuit 220 may include a status (signal) generator 225 and the status generator 225 may generate a status signal RnB indicating an operating status of the nonvolatile memory device 50. The status signal RnB may be referred to as a ready/busy signal because of the status signal RnB indicates either busy state or a ready state of the nonvolatile memory device 50.

The address decoder 240 may be coupled to the memory cell array 100 through the string selection line SSL, the plurality of word-lines WLs, and the ground selection line GSL. During a program operation or read operation, the address decoder 240 may determine one of the plurality of word-lines WLs as a selected word-line based on the row address R_ADDR and may determine the rest of the plurality of word-lines WLs except the selected word-line as unselected word-lines.

The voltage generator 230 may generate word-line voltages VWLs associated with operations of the nonvolatile memory device 50 using power PWR provided from the memory controller based on control signals CTLs from the control circuit 220. The word-line voltages VWLs may include a program voltage, a read voltage, a pass voltage, an erase verification voltage, or a program verification voltage. The word-line voltages VWLs may be applied to the plurality of word-lines WLs through the address decoder 240.

For example, during the erase operation, the voltage generator 230 may apply erase voltage to a well of a selected memory block and may apply a ground voltage to all word-lines of the selected memory block. During the erase verification operation, the voltage generator 230 may apply erase verification voltage to all word-lines of the selected memory block or may apply the erase verification voltage to the word-lines of the selected memory block on a word-line basis.

For example, during the program operation, the voltage generator 230 may apply a program voltage to the selected word-line and may apply a program pass voltage to the unselected word-lines. In addition, during the program verification operation, the voltage generator 230 may apply a program verification voltage to the selected word-line and may apply a verification pass voltage to the unselected word-lines. In addition, during the read operation, the voltage generator 230 may apply a read voltage to the selected word-line and may apply a read pass voltage to the unselected word-lines.

The page buffer circuit 210 may be coupled to the memory cell array 100 through the plurality of bit-lines BLs.

The page buffer circuit 410 may include a plurality of page buffers PB and a page buffer driver (PBD) 215. During the program operation, the page buffer circuit 210 may temporarily store data to be programmed in a selected page or during the read operation, the page buffer circuit 210 may temporarily store data read out from the selected page of the memory cell array 100. The page buffer driver 251 may transfer data provided from the data transfer circuit 300 to the plurality of page buffers PB during the program operation, and may transfer data provided from the plurality of page buffers PB to the data transfer circuit 300.

Figure 7:
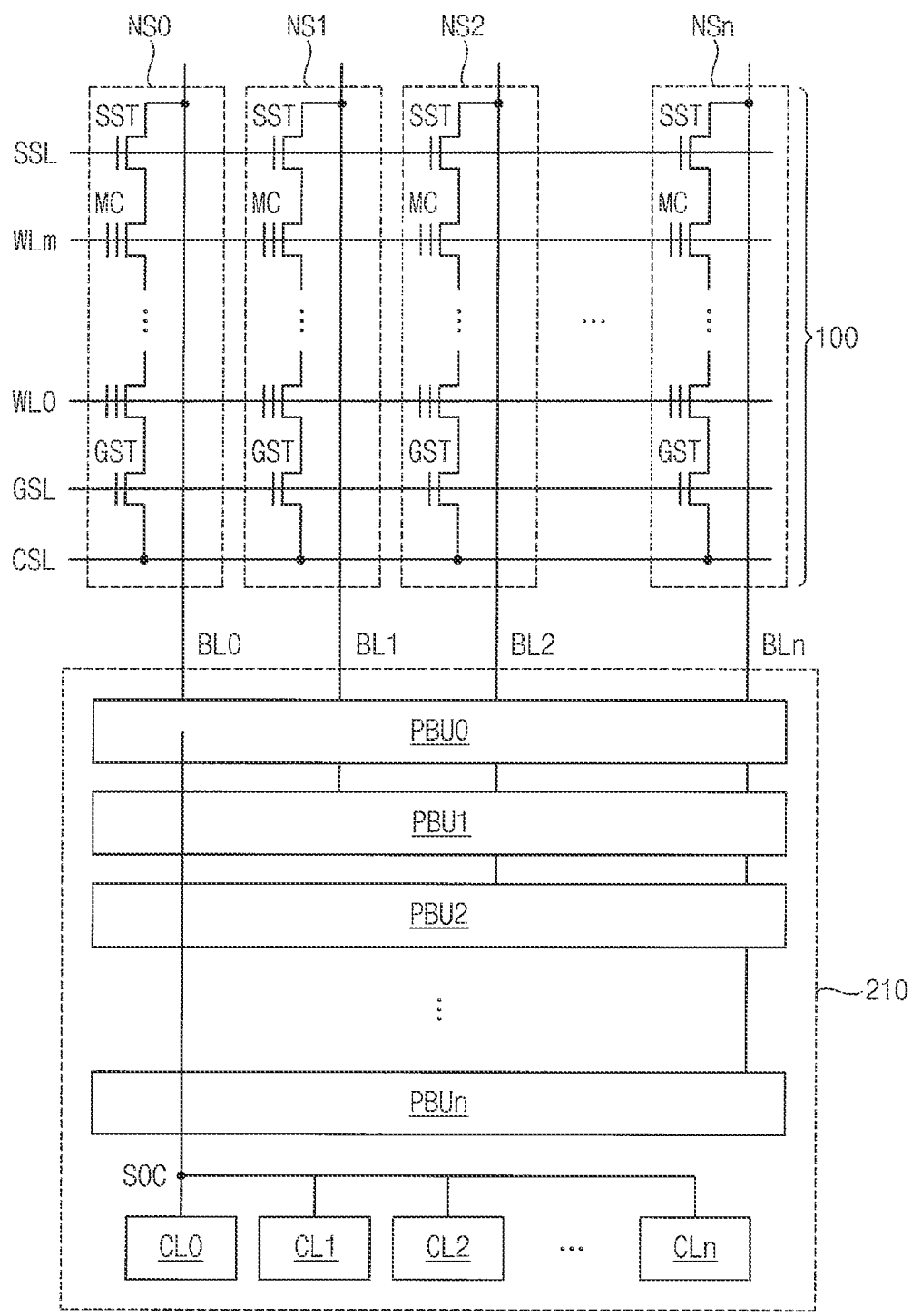
FIG. 7 is a schematic diagram of a connection of the memory cell array to the page buffer circuit in FIG. 1, according to exemplary embodiments.

In exemplary embodiments, page buffer units included in each of the plurality of page buffers PB (for example, first through (n+1)th page buffer units PBU0 through PBUn in FIG. 7) and cache latches included in each of the plurality of page buffers PB (for example, first through (n+1)th cache latches CL0 through CLn in FIG. 7) may be apart from each other, and have separate structures. Accordingly, the degree of freedom of wirings on the page buffer units may be improved, and the complexity of a layout may be reduced. In addition, because the cache latches are adjacent to the data I/O lines, the distance between the cache latches and the data I/O lines may be reduced, and thus, data I/O speed may be improved.

The data transfer circuit 300 may include (a plurality of) first repeaters 310, (a plurality of) second repeaters 350 and a plurality of signal lines 380.

The first repeaters 310 may be connected to the data I/O circuit 250, the second repeaters 350 may be connected to the page buffer driver 215 in the page buffer circuit 210 and the plurality of signal lines 380 may connect the first repeaters 310 and the second repeaters 350 with respect to each other.

The first repeaters 310 may include a first group of repeaters that are activated in a first operation mode and a second group of repeaters that are activated in a second operation mode. The second repeaters 350 may include a third group of repeaters that are activated in the first operation mode and a fourth group of repeaters that are activated in the second operation mode. The third group of repeaters may be connected to the first group of repeaters through a first group of signal lines from the signal lines 380 and the fourth group of repeaters may be connected to the second group of repeaters through a second group of signal lines from the signal lines 380.

The first group of signal lines and the second group of signal lines may be alternatingly arranged. That is, each of the first group of signal lines and each of the second group of signal lines may be alternatingly arranged with respect to each other.

The second group of signal lines may be floated in the first operation mode to reduce capacitance of the first group of signal lines, the first group of signal lines may be floated in the second operation mode to reduce capacitance of the second group of signal lines, and thus, the data transfer circuit 300 may reduce power consumed in the signal lines 380 transferring data in the first operation mode and the second operation mode.

In the second operation mode, the first group of repeaters may float an output node coupled to the first group of signal lines in response to the first power gating signal PGS1 and the third group of repeaters may float an input node coupled to the first group of signal lines in response to the first power gating signal PGS1.

In the first operation mode, the second group of repeaters may float an output node coupled to the second group of signal lines in response to the second power gating signal PGS2 and the fourth group of repeaters may float an input node coupled to the second group of signal lines in response to the second power gating signal PGS2.

In exemplary embodiments, the first operation may correspond to a write operation or a write operation mode and the second operation mode may correspond to a read operation or a read operation mode. In addition, the first operation mode and the second operation mode may have non-overlapping operating intervals with respect to each other. That is, the second operation mode may have a non-overlapping operating interval with the first operation mode.

In FIG. 1, although it is described as the data transfer circuit 300 is connected between the data I/O circuit 250 and the page buffer circuit 210, the data transfer circuit 300 may be disposed between a first circuit element and a second circuit element which are disposed in a data I/O path of the nonvolatile memory device 50 and may transfer data between the first circuit element and the second circuit element.

When the data transfer circuit 300 is disposed between the first circuit element and the second circuit element which are disposed in the data I/O path of the nonvolatile memory device 50, the first operation mode may correspond to an operation to transfer data from the first circuit element to the second circuit element and the second operation mode may correspond to an operation to transfer data from the second circuit element to the first circuit element.

The data I/O circuit 250 may be connected to page buffer circuit 210 through the data transfer circuit 300. During the program operation, the data I/O circuit 420 may receive program data DATA from the memory controller (20 in FIG. 2) and provide the program data DATA to the page buffer circuit 410 through the data transfer circuit 300 based on the column address C ADDR received from the control circuit 220. During the read operation, the data I/O circuit 250 may receive the read data DATA from the page buffer circuit 210 through the data transfer circuit 300 based on the column address C ADDR received from the control circuit 220 and may provide read data DATA to the memory controller 20.

The data I/O circuit 250 may include a serializer/deserializer (SERDES) 255. During the program operation, the SERDES 255 may parallelize the program data DATA to provide parallelized data to the data transfer circuit 300 and during the read operation, the SERDES 255 may serialize the read data DATA from the data transfer circuit 300 to provide serialized data to the memory controller 20.

Figure 2:
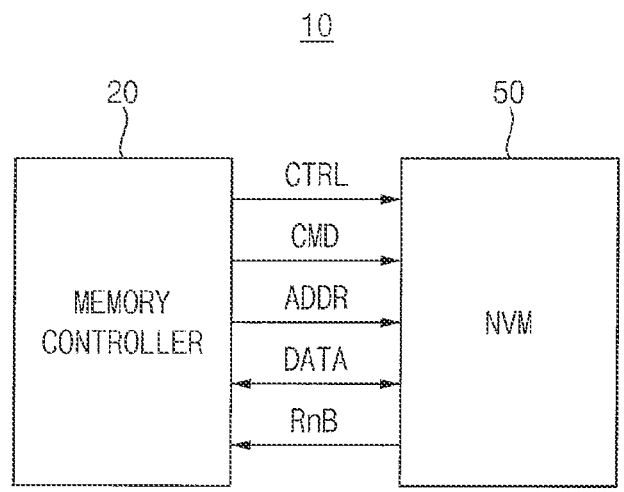
FIG. 2 is a block diagram illustrating a memory system including the nonvolatile memory device according to exemplary embodiments.

FIG. 2 is a block diagram illustrating a memory system including the nonvolatile memory device according to exemplary embodiments.

Referring to FIG. 2, a memory system 10 may include a memory controller 20 and the nonvolatile memory device (NVM) 50.

The memory controller 20 may control operation of the nonvolatile memory device 50 by applying control signal CTRL, the command CMD and address ADDR to the nonvolatile memory device 50 and may exchange the data DATA with the nonvolatile memory device 50. The nonvolatile memory device 50 may provide the memory controller 20 with the status signal RnB indicating operating status of the nonvolatile memory device 50. For example, when the status signal RnB has a logic high level (ready state), the status signal RnB indicates that the nonvolatile memory device 50 is ready for receiving a command from the memory controller 20.

Figure 3:
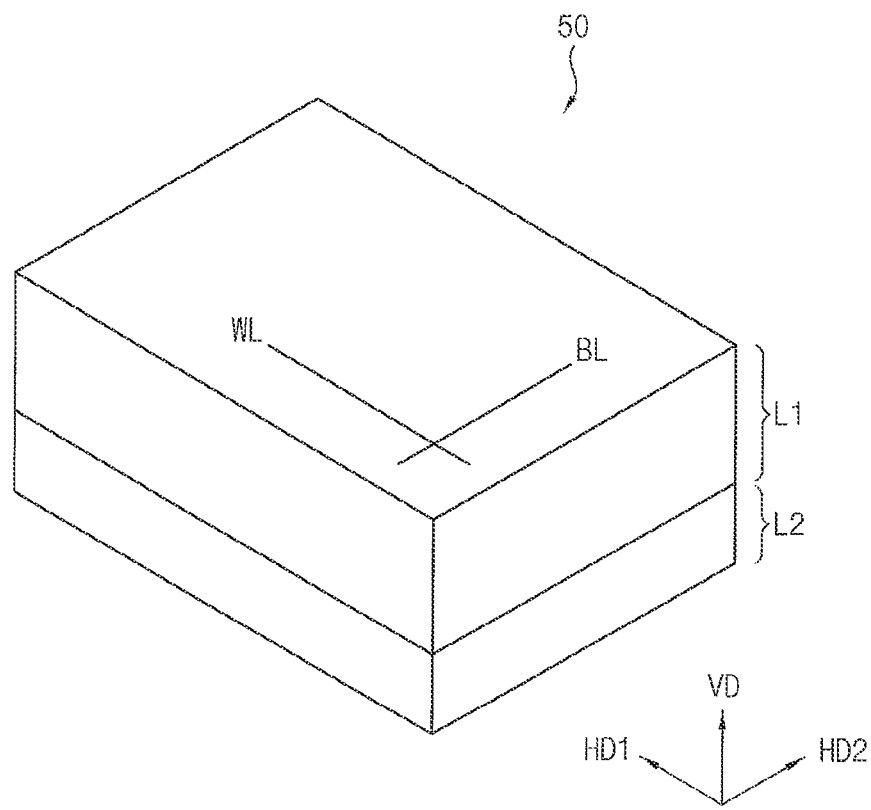
FIG. 3 schematically illustrates a structure of the nonvolatile memory device of FIG. 1 according to exemplary embodiments.

FIG. 3 schematically illustrates a structure of the nonvolatile memory device of FIG. 1 according to exemplary embodiments.

Referring to FIG. 3, the nonvolatile memory device 50 may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to a substrate.

In exemplary embodiments, the memory cell array 100 in FIG. 1 may be formed (or, provided) on the first semiconductor layer L1, and the peripheral circuit 200 in FIG. 1 may be formed (or, provided) on the second semiconductor layer L2. Accordingly, the nonvolatile memory device 50 may have a structure in which the memory cell array 100 is on the peripheral circuit 200, that is, a cell over periphery (COP) structure. The COP structure may effectively reduce an area in a horizontal direction and improve the degree of integration of the nonvolatile memory device 50.

In exemplary embodiments, the second semiconductor layer L2 may include the substrate, and by forming transistors on the substrate and metal patterns for wiring transistors, the peripheral circuit 200 may be formed in the second semiconductor layer L2. After the peripheral circuit 200 is formed on the second semiconductor layer L2, the first semiconductor layer L1 including the memory cell array 100 may be formed, and the metal patterns for connecting the word-lines WL and the bit-lines BL of the memory cell array 100 to the peripheral circuit 200 formed in the second semiconductor layer L2 may be formed. For example, the word-lines WL may extend in a first horizontal direction HD1 and the bit-lines BL may extend in a second horizontal direction HD2.

As the number of stages of memory cells in the memory cell array 100 increases with the development of semiconductor processes, that is, as the number of stacked word-lines WL increases, an area of the memory cell array 100 may decrease, and accordingly, an area of the peripheral circuit 200 may also be reduced. According to exemplary embodiments, to reduce an area of a region occupied by the page buffer circuit 210, the page buffer circuit 210 may have a structure in which the page buffer unit and the cache latch are separated from each other, and may connect sensing nodes included in each of the page buffer units commonly to a combined sensing node.

Figure 4:
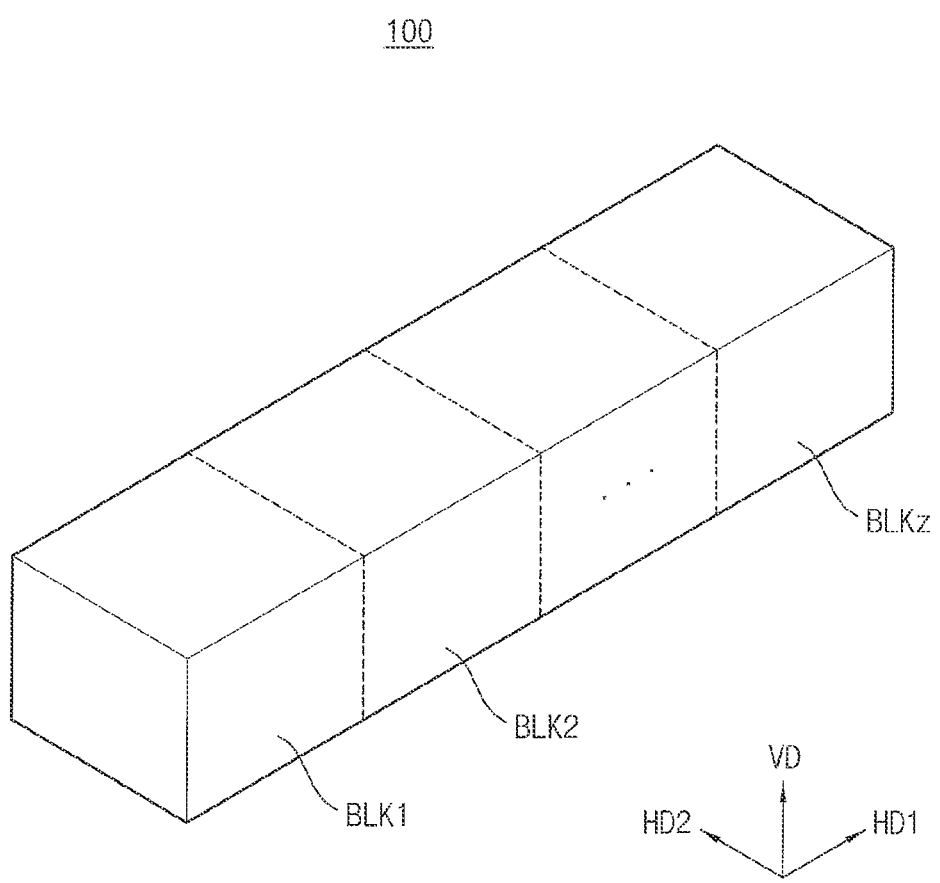
FIG. 4 is a block diagram illustrating an example of the memory cell array in FIG. 1 according to exemplary embodiments.

FIG. 4 is a block diagram illustrating an example of the memory cell array in FIG. 1 according to exemplary embodiments.

Referring to FIG. 4, the memory cell array 100 may include a plurality of memory blocks BLK1 to BLKz which extend along a plurality of directions HD1, HD2 and VD. In an embodiment, the memory blocks BLK1 to BLKz are selected by the address decoder 240 in FIG. 1. For example, the address decoder 240 may select a memory block BLK corresponding to a block address among the memory blocks BLK1 to BLKz.

Figure 5:
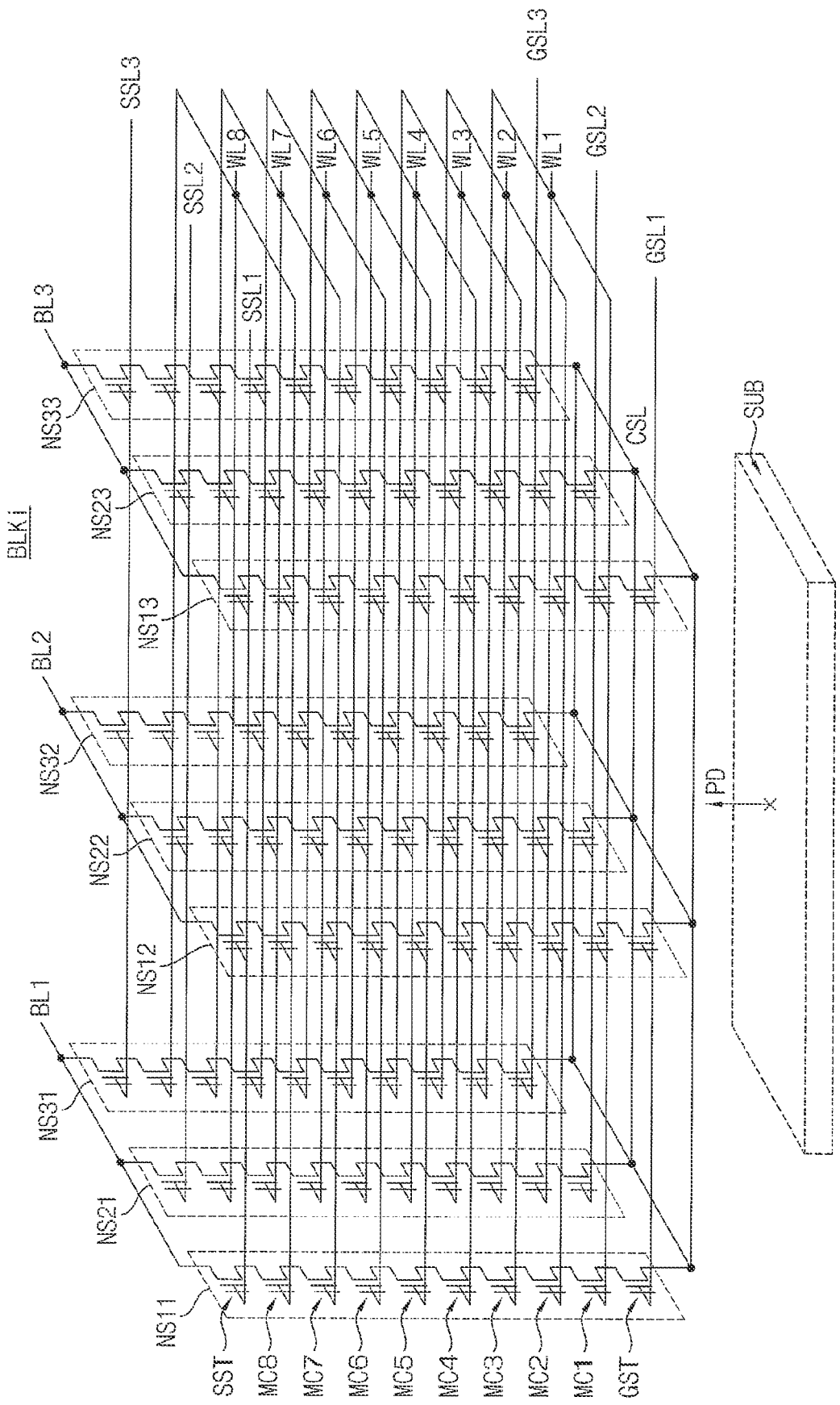
FIG. 5 is a circuit diagram illustrating one of the memory blocks of FIG. 4.

FIG. 5 is a circuit diagram illustrating one of the memory blocks of FIG. 4.

The memory block BLKi of FIG. 5 may be formed on a substrate SUB in a three-dimensional structure (or a vertical structure). Here, i may be one of 1 to z. For example, a plurality of memory cell strings included in the memory block BLKi may be formed in a direction PD perpendicular to the substrate SUB. The direction PD may correspond to the direction VD in FIG. 4.

Referring to FIG. 5, the memory block BLKi may include (memory) cell strings NS11, NS21, NS31, NS12, NS22, NS32, NS13, NS23 and NS33 coupled between bit-lines BL1, BL2 and BL3 and a common source line CSL. Each of the memory cell strings NS11, NS21, NS31, NS12, NS22, NS32, NS13, NS23 and NS33 may include a string selection transistor SST, a plurality of memory cells MC1, MC2, MC3, MC4, MC6, MC7 and MC8, and a ground selection transistor GST. In FIG. 5, each of the memory cell strings NS11, NS21, NS31, NS12, NS22, NS32, NS13, NS23 and NS33 is illustrated to include eight memory cells MC1, MC2, MC3, MC4, MC6, MC7 and MC8. However, exemplary embodiments are not limited thereto. In some exemplary embodiments, each of the cell strings NS11, NS21, NS31, NS12, NS22, NS32, NS13, NS23 and NS33 may include any number of memory cells.

The string selection transistor SST may be connected to corresponding string selection lines SSL1, SSl2 and SSL3. The plurality of memory cells MC1, MC2, MC3, MC4, MC6, MC7 and MC8 may be connected to corresponding word-lines WL1, WL2, WL3, WLS, WLS, WL6, WL7 and WL8, respectively. The ground selection transistor GST may be connected to corresponding ground selection lines GSL1, GSL2 and GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1, GSL2 and GSL3 and the string selection lines SSL1, SSl2 and SSL3 may be separated.

Figure 6:
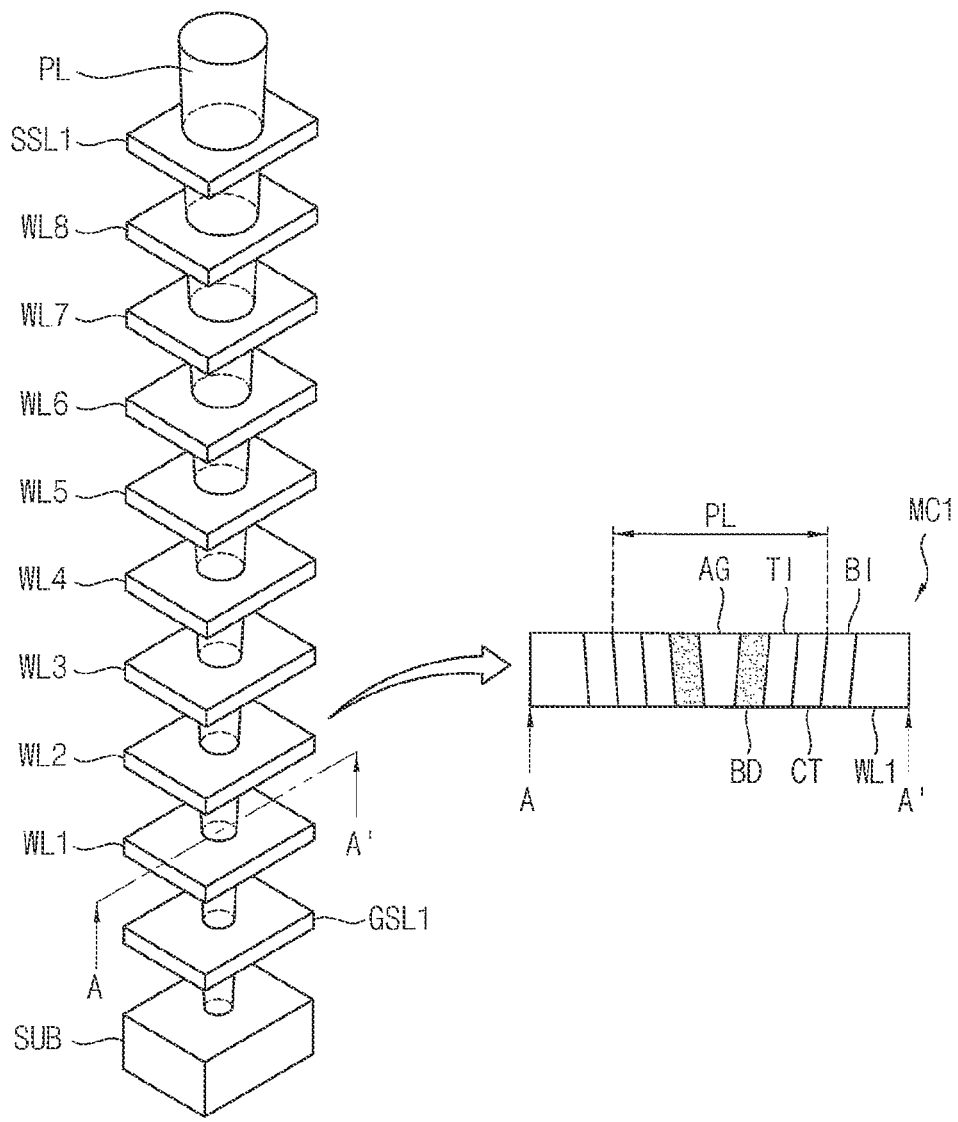
FIG. 6 illustrates an example of a structure of a cell string CS in the memory block of FIG. 5.

FIG. 6 illustrates an example of a structure of a cell string CS in the memory block of FIG. 5.

Referring to FIGS. 5 and 6, a pillar PL is provided on the substrate SUB such that the pillar PL extends in a direction perpendicular to the substrate SUB to make contact with the substrate SUB. Each of the ground selection line GSL, the word-lines WL1, WL2, WL3, WLS, WLS, WL6, WL7 and WL8, and the string selection lines SSL illustrated in FIG. 6 may be formed of a conductive material parallel with the substrate SUB, for example, a metallic material. The pillar PL may be in contact with the substrate SUB through the conductive materials forming the string selection lines SSL, the word-lines WL1, WL2, WL3, WLS, WLS, WL6, WL7 and WL8, and the ground selection line GSL.

A sectional view taken along a line A-A' is also illustrated in FIG. 6. In some exemplary embodiments, a sectional view of a first memory cell MC1 corresponding to a first word-line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

FIG. 7 is a schematic diagram of a connection of the memory cell array to the page buffer circuit in FIG. 1, according to exemplary embodiments.

Referring to FIG. 7, the memory cell array 100 may include first through (n+1)th (NAND) cell strings NS0 through NSn, each of the first through (n+1)th NAND cell strings NS0 through NSn may include a ground select transistor GST connected to the ground select line GSL, a plurality of memory cells MC respectively connected to the first through (m+1)th word-lines WL0 through WLm, and a string select transistor SST connected to the string select line SSL, and the ground select transistor GST, the plurality of memory cells MC, and the string select transistor SST may be connected to each other in series. In this case, m may be a positive integer.

The page buffer circuit 210 may include first through (n+1)th page buffer units PBU0 through PBUn. The first page buffer unit PB0 may be connected to the first NAND string NS0 via the first bit-line BL0, and the (n+1)th page buffer unit PBUn may be connected to the (n+1)th NAND cell string NSn via the (n+1)th bit-line BLn. In this case, n may be a positive integer. For example, n may be 7, and the page buffer circuit 210 may have a structure in which page buffer units of eight stages, or, the first through (n+1)th page buffer units PBU0 through PBUn are in a line. For example, the first through (n+1)th page buffer units PBU0 through PBUn may be in a row in an extension direction of the first through (n+1)th bit-lines BL0 through BLn.

The page buffer circuit 210 may further include first through (n+1)th cache latches CL0 through CLn respectively corresponding to the first through (n+1)th page buffer units PBU0 through PBUn. For example, the page buffer circuit 210 may have a structure in which the cache latches of eight stages or the first through (n+1)th cache latches CL0 through CLn in a line. For example, the first through (n+1)th cache latches CL0 through CLn may be in a row in an extension direction of the first through (n+1)th bit-lines BL0 through BLn.

The sensing nodes of each of the first through (n+1)th page buffer units PBU0 through PBUn may be commonly connected to a combined sensing node SOC. In addition, the first through (n+1)th cache latches CL0 through CLn may be commonly connected to the combined sensing node SOC. Accordingly, the first through (n+1)th page buffer units PBU0 through PBUn may be connected to the first through (n+1)th cache latches CL0 through CLn via the combined sensing node SOC.

Figure 8:
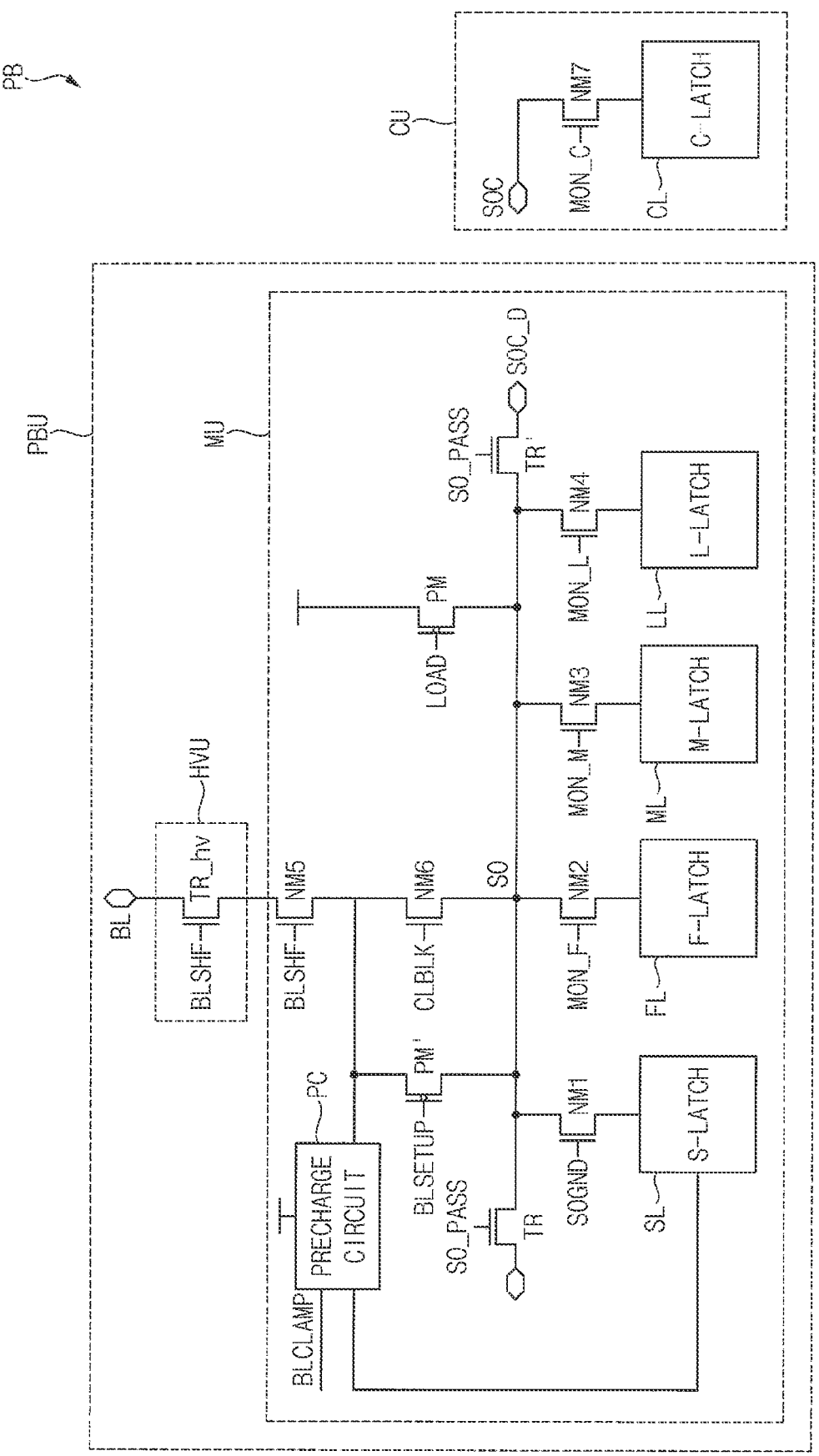
FIG. 8 illustrates in detail a page buffer according to exemplary embodiments.

FIG. 8 illustrates in detail a page buffer according to exemplary embodiments.

Referring to FIG. 8, the page buffer PB may correspond to an example of the page buffer PB in FIG. 1. The page buffer PB may include a page buffer unit PBU and a cache unit CU. Because the cache unit CU includes a cache latch (C-LATCH) CL, and the C-LATCH CL is connected to a data input/output line, the cache unit CU may be adjacent to the data input/output line. Accordingly, the page buffer unit PBU and the cache unit CU may be apart from each other, and the page buffer PB may have a structure in which the page buffer unit PBU and the cache unit CU are apart from each other.

The page buffer unit PBU may include a main unit MU. The main unit MU may include main transistors in the page buffer PB. The page buffer unit PBU may further include a bit-line selection transistor TR_hv that is connected to the bit-line BL and driven by a bit-line selection signal BLSLT. The bit-line select transistor TR_hv may include a high voltage transistor, and accordingly, the bit-line selection transistor TR_hv may be in a different well region from the main unit MU, that is, in a high voltage unit HVU.

The main unit MU may include a sensing latch (S-LATCH) SL, a force latch (F-LATCH) FL, an upper bit latch (M-LATCH) ML and a lower bit latch (L-LATCH) LL. According to an embodiment, the S-LATCH SL, the F-LATCH FL, the M-LATCH ML, or the L-LATCH LL may be referred to as main latches. The main unit MU may further include a precharge circuit PC capable of controlling a precharge operation on the bit-line BL or a sensing node SO based on a bit-line clamping control signal BLCLAMP, and may further include a transistor PM' driven by a bit-line setup signal BLSETUP.

The S-LATCH SL may, during a read or program verification operation, store data stored in a memory cell MC or a sensing result of a threshold voltage of the memory cell MC. In addition, the S-LATCH SL may, during a program operation, be used to apply a program bit-line voltage or a program inhibit voltage to the bit-line BL. The F-LATCH FL may be used to improve threshold voltage distribution during the program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit-line voltage may be controlled, and the program threshold voltage distribution may be formed narrower.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. In addition, the C-LATCH CL may receive data read from a memory cell MC during the read operation from the S-LATCH SL, and output the received data externally via the data input/output line.

In addition, the main unit MU may further include first through fourth transistors NM1 through NM4. The first transistor NM1 may be connected between the sensing node SO and the S-LATCH SL, and may be driven by a ground control signal SOGND. The second transistor NM2 may be connected between the sensing node SO and the F-LATCH FL, and may be driven by a forcing monitoring signal MON_F. The third transistor NM3 may be connected between the sensing node SO and the M-LATCH ML, and may be driven by a higher bit monitoring signal MON_M. The fourth transistor NM4 may be connected between the sensing node SO and the L-LATCH LL, and may be driven by a lower bit monitoring signal MON_L.

In addition, the main unit MU may further include fifth and sixth transistors NM5 and NM6 connected to each other in series between the bit-line selection transistor TV by and the sensing node SO. The fifth transistor NM5 may be driven by a bit-line shut-off signal BLSHF, and the sixth transistor NM6 may be driven by a bit-line connection control signal CLBLK. In addition, the main unit MU may further include a precharge transistor PM. The precharge transistor PM may be connected to the sensing node SO, driven by a load signal LOAD, and precharge the sensing node SO to a precharge level in a precharge period.

In an embodiment, the main unit MU may further include a pair of pass transistors connected to the sensing node SO, or first and second pass transistors TR and TR'. According to an embodiment, the first and second pass transistors TR and TR may also be referred to as first and second sensing node connection transistors, respectively. The first and second pass transistors TR and TR' may be driven in response to a pass control signal SO_PASS. According to an embodiment, the pass control signal SO_PASS may be referred to as a sensing node connection control signal. The first pass transistor TR may be connected between a first terminal SOC_U and the sensing node SO, and the second pass transistor TR' may be between the sensing node SO and a second terminal SOC_D.

For example, when the page buffer unit PBU corresponds to the second page buffer unit PBU1 in FIG. 7, the first terminal SOC_U may be connected to one end of the pass transistor included in the first page buffer unit PBU0, and the second terminal SOC_D may be connected to one end of the pass transistor included in the third page buffer unit PBU2. In this manner, the sensing node SO may be electrically connected to the combined sensing node SOC via pass transistors included in each of the third through (n+1)th page buffer units PBU2 through PBUn.

During the program operation, the page buffer PB may verify whether the program is completed in a memory cell MC selected among the memory cells MC included in the NAND cell string connected to the bit-line BL. The page buffer PB may store data sensed via the bit-line BL during the program verify operation in the S-LATCH SL. The M-LATCH ML and the L-LATCH LL may be set in which target data is stored according to the sensed data stored in the S-LATCH SL. For example, when the sensed data indicates that the program is completed, the M-LATCH ML and the L-LATCH LL may be switched to a program inhibit setup for the selected memory cell MC in a subsequent program loop. The C-LATCH CL may temporarily store input data provided from the outside. During the program operation, the target data to be stored in the C-LATCH CL may be stored in the M-LATCH ML and the L-LATCH LL.

Hereinafter, assuming that signals for controlling elements in the page buffer circuit 210 are included in the page buffer control signal PBCTL1 in FIG. 1.

Figure 9:
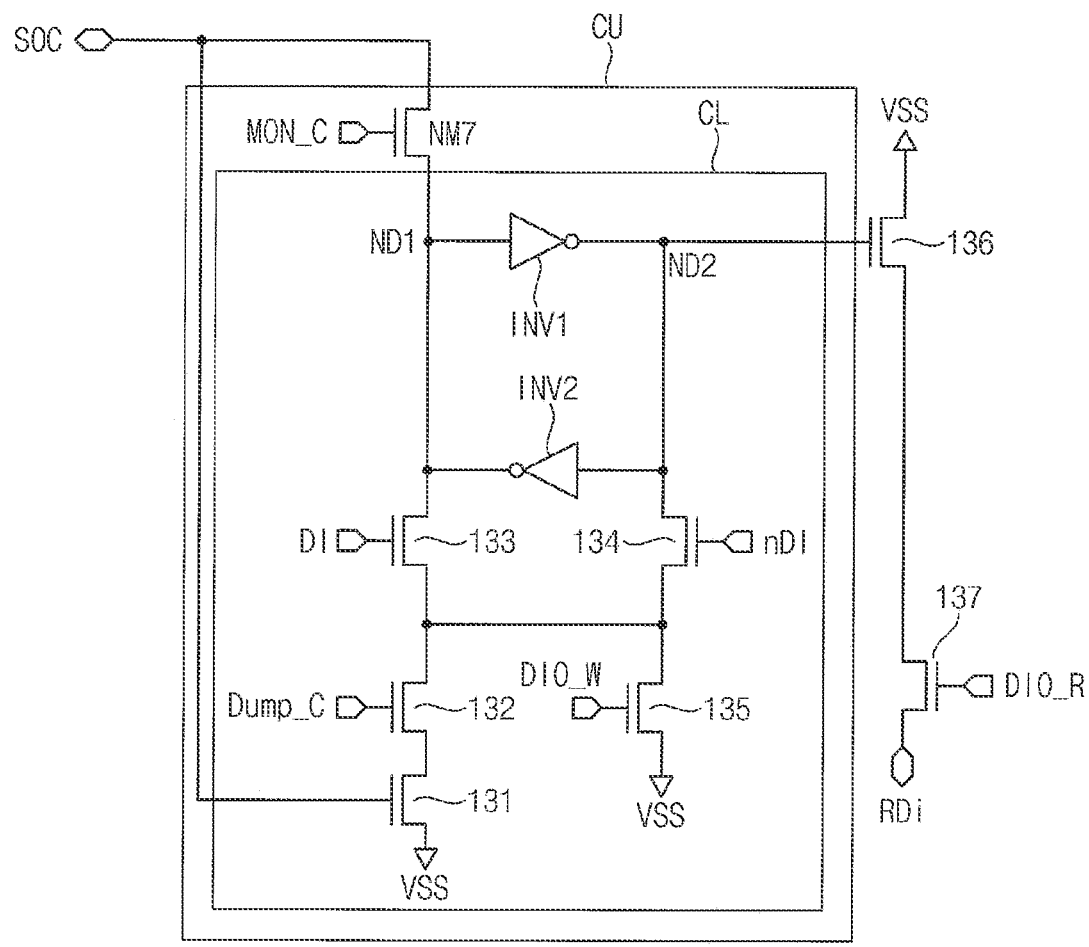
FIG. 9 is a circuit diagram illustrating an example of the cache unit according to exemplary embodiments.

FIG. 9 is a circuit diagram illustrating an example of the cache unit according to exemplary embodiments.

Referring to FIGS. 8 and 9, the cache unit CU may include the monitor transistor NM7 and the C-LATCH CL, and the C-LATCH CL may include first and second inverters INV1 and INV2, a dump transistor 132, and transistors 131, 133 to 135. The monitor transistor NM7 may be driven based on the cache monitoring signal MON_C, and may control a connection between the coupling sensing node SOC and the C-LATCH CL.

The first inverter INV1 may be connected between the first node ND1 and the second node ND2, the second inverter INV2 may be connected between the second node ND2 and the first node ND1, and thus, the first and second inverters INV1 and INV2 may form a latch. The transistor 131 may include a gate connected to the combined sensing node SOC. The dump transistor 132 may be driven by a dump signal Dump_C, and may transmit data stored in the C-LATCH CL to a main latch, for example, the S-LATCH SL in the page buffer unit PBU. The transistor 133 may be driven by a data signal DI, a transistor 134 may be driven by a data inversion signal nDI, and the transistor 135 may be driven by a write control signal DIO_W. When the write control signal DIO_W is activated, voltage levels of the first and second nodes ND1 and ND2 may be determined based on the data signal DI and the data inversion signal nDI, respectively.

The cache unit CU may be connected to an data I/O line (or data I/O terminal) RDi via transistors 136 and 137. The transistor 136 may include a gate connected to the second node ND2, and may be turned on or off based on a voltage level of the second node ND2. The transistor 137 may be driven by a read control signal DIO_R. When the read control signal DIO_R is activated and the transistor 137 is turned on, a voltage level of the input/output terminal RDi may be determined as '1' or '0' based on a state of the C-LATCH CL.

Figure 10:
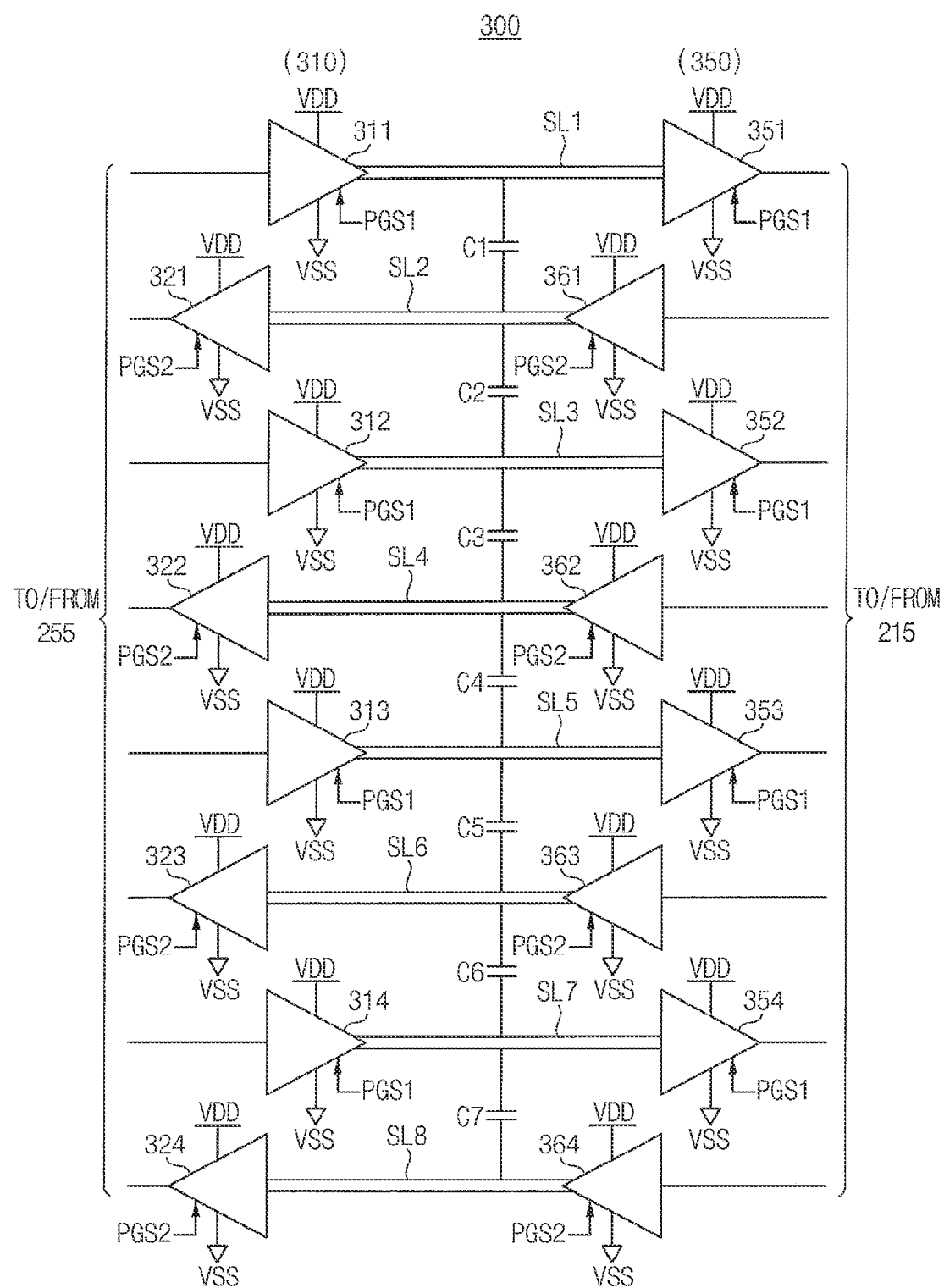
FIG. 10 illustrates an example of the data transfer circuit in the nonvolatile memory device of FIG. 1 according to exemplary embodiments.

FIG. 10 illustrates an example of the data transfer circuit in the nonvolatile memory device of FIG. 1 according to exemplary embodiments.

Referring to FIGS. 1 and 10, the data transfer circuit 300 may include the plurality of first repeaters 310 connected to the SERDES 255 in the data I/O circuit 250, the plurality of second repeaters 350 connected to the page buffer driver 215 in the page buffer circuit 210 and the plurality of signal lines 380.

The plurality of signal lines 380 may connect the first repeaters 310 and the second repeaters 350 with respect to each other.

The first repeaters 310 may include a first group of repeaters 311, 312, 313 and 314 that are activated in the first operation mode and a second group of repeaters 321, 322, 323 and 324 that are activated in the second operation mode. The second repeaters 350 may include a third group of repeaters 351, 352, 353 and 354 that are activated in the first operation mode and a fourth group of repeaters 361, 362, 363 and 364 that are activated in the second operation mode.

Each of the first group of repeaters 311, 312, 313 and 314 and the third group of repeaters 351, 352, 353 and 354 may be connected between a power supply voltage VDD and a ground voltage VSS and may operate in response to the first power gating signal PGS1. Each of the second group of repeaters 321, 322, 323 and 324 and the fourth group of repeaters 361, 362, 363 and 364 may be connected between the power supply voltage VDD and the ground voltage VSS and may operate in response to the second power gating signal PGS2.

The plurality of signal lines 380 may include a first group of signal lines SL1, SL3, SL5 and SL7 that connect respective one of the first group of repeaters 311, 312, 313 and 314 and respective one of the third group of repeaters 351, 352, 353 and 354 with respect to each other and a second group of signal lines SL2, SL4, SL6 and SL8 that that connect respective one of the second group of repeaters 321, 322, 323 and 324 and respective one of the fourth group of repeaters 361, 362, 363 and 364 with respect to each other. The first group of signal lines SL1, SL3, SL5 and SL7 and the second group of signal lines SL2, SL4, SL6 and SL8 may be alternatingly arranged. That is, each of the first group of signal lines SL1, SL3, SL5 and SL7 and respective one of the second group of signal lines SL2, SL4, SL6 and SL8 may be alternatingly arranged.

Because the first group of signal lines SL1, SL3, SL5 and SL7 and the second group of signal lines SL2, SL4, SL6 and SL8 are formed using a metal, capacitance C1 may be generated between the signal lines SL1 and SL2, capacitance C2 may be generated between the signal lines SL2 and SL3, capacitance C3 may be generated between the signal lines SL3 and SL4, capacitance C4 may be generated between the signal lines SL4 and SL5, capacitance C5 may be generated between the signal lines SL5 and SL6, capacitance C6 may be generated between the signal lines SL6 and SL7 and capacitance C7 may be generated between the signal lines SL7 and SL8.

When each of the first group of signal lines SL1, SL3, SL5 and SL7 is floated in the second operation mode and each of the second group of signal lines SL2, SL4, SL6 and SL8 is floated in the first operation mode, capacitances that may be generated between adjacent signal lines transferring data is likely to be connected in series. When the capacitances are connected in series, a total capacitance is reduced and thus, power consumed in the signal lines transferring data may be reduced.

In FIG. 10, the signal lines 380 are illustrated to include eight signal lines SL1, SL2, SL3, SL4, SL4, SL5, SL6, SL7 and SL8 for convenience of explanation, but exemplary embodiments are not limited thereto. A number of the signal lines 380 may include a few hundred or a few thousand.

Figure 11A:
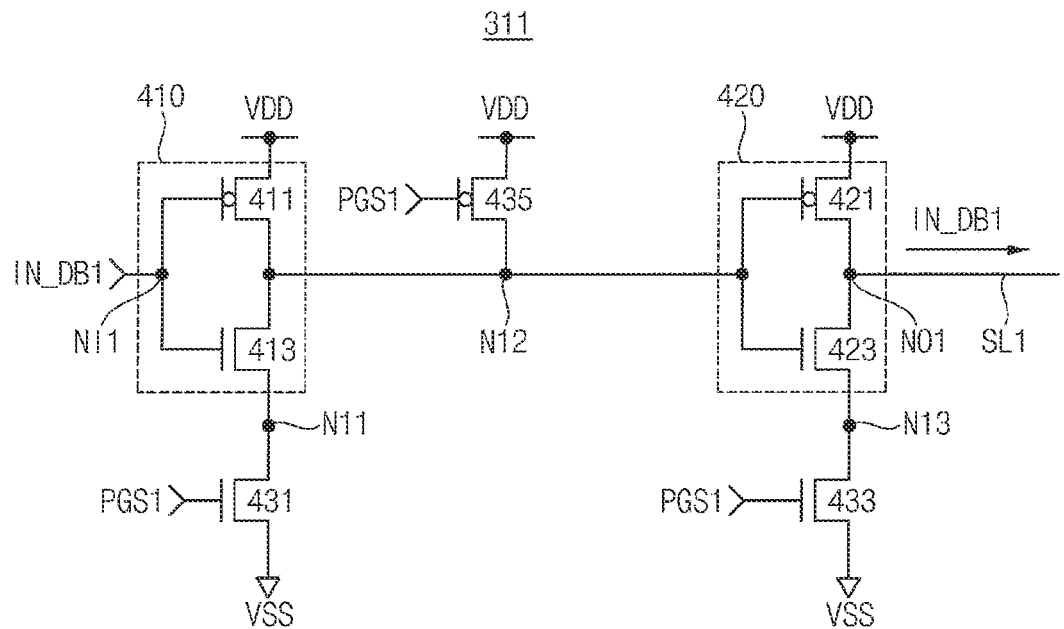
FIG. 11A is a circuit diagram of one of the first group of repeaters in the data transfer circuit of FIG. 10 according to exemplary embodiments.

FIG. 11A is a circuit diagram of one of the first group of repeaters in the data transfer circuit of FIG. 10 according to exemplary embodiments.

FIG. 11A illustrates a configuration of the repeater 311 of the first group of repeaters 311, 312, 313 and 314 and each of the first group of repeaters 312, 313 and 314 and the third group of repeaters 351, 352, 353 and 354 may have the same configuration as the repeater 311.

Referring to FIG. 11A, the repeater 311 may include a first inverter 410, a second inverter 420, a first discharge transistor 431, a second discharge transistor 433 and a precharge transistor 435.

The first inverter 410 may be connected between the power supply voltage VDD and a first node N11 and may include a p-channel metal-oxide semiconductor (PMOS) transistor 411 and an n-channel metal-oxide semiconductor (NMOS) transistor 413. The PMOS transistor 411 may be connected between the power supply voltage VDD and a second node N12 corresponding to an output of the first inverter 410 and the NMOS transistor 413 may be connected between the second node N12 and the first node N11. Gates of the PMOS transistor 411 and the NMOS transistor 413 may be commonly coupled to an input node NI1 and may receive an input data bit IN_DB1.

The first discharge transistor 431 may be connected between the first node N11 and the ground voltage VSS and may include an NMOS transistor that has a drain coupled to the first node N11, a source coupled to the ground voltage VSS and a gate receiving the first power gating signal PGS1. The first discharge transistor 431 may discharge (or, pull-down) the first node N11 to the ground voltage VSS in response to the first power gating signal PGS1 having a logic high level.

The precharge transistor 435 may be connected between the power supply voltage VDD and the second node N12 and may include a PMOS transistor that has a source coupled to the power supply voltage VDD, a drain coupled to the second node N12 and a gate receiving the first power gating signal PGS1. The precharge transistor 435 may precharge (or, pull-up) the second node N12 with the power supply voltage VDD in response to the first power gating signal PGS1 having a logic low level.

The second inverter 420 may be connected between the power supply voltage VDD and a third node N13 and may include a PMOS transistor 421 and an NMOS transistor 423. The PMOS transistor 421 may be connected between the power supply voltage VDD and an output node NO1 coupled to the signal line SL1 and the NMOS transistor 423 may be connected between the output node NO1 and the third node N13. Gates of the PMOS transistor 421 and the NMOS transistor 423 may be commonly coupled to the second node N12 and the second inverter 420 may invert a voltage level of the second node N12 to provide the input data bit IN_DB1 at the output node NO1.

The second discharge transistor 433 may be connected between the third node N13 and the ground voltage VSS and may include an NMOS transistor that has a drain coupled to the third node N13, a source coupled to the ground voltage VSS and a gate receiving the first power gating signal PGS1. The second discharge transistor 433 may discharge the third node N13 to the ground voltage VSS in response to the first power gating signal PGS1 having a logic high level.

The first power gating signal PGS1 may have a logic high level in the first operation mode and may have a logic low level in the second operation mode. In response to the first power gating signal PGS1 having a logic high level, the first discharge transistor 431 may discharge the first node N11 to the ground voltage VSS and the second discharge transistor 433 may discharge the third node N13 to the ground voltage VSS. Therefore, the first inverter 410 inverts the input data bit IN_DB1 and the second inverter 420 inverts the voltage level of the second node N12 to provide the input data bit IN_DB1 at the output node NO1.

Figure 11B:
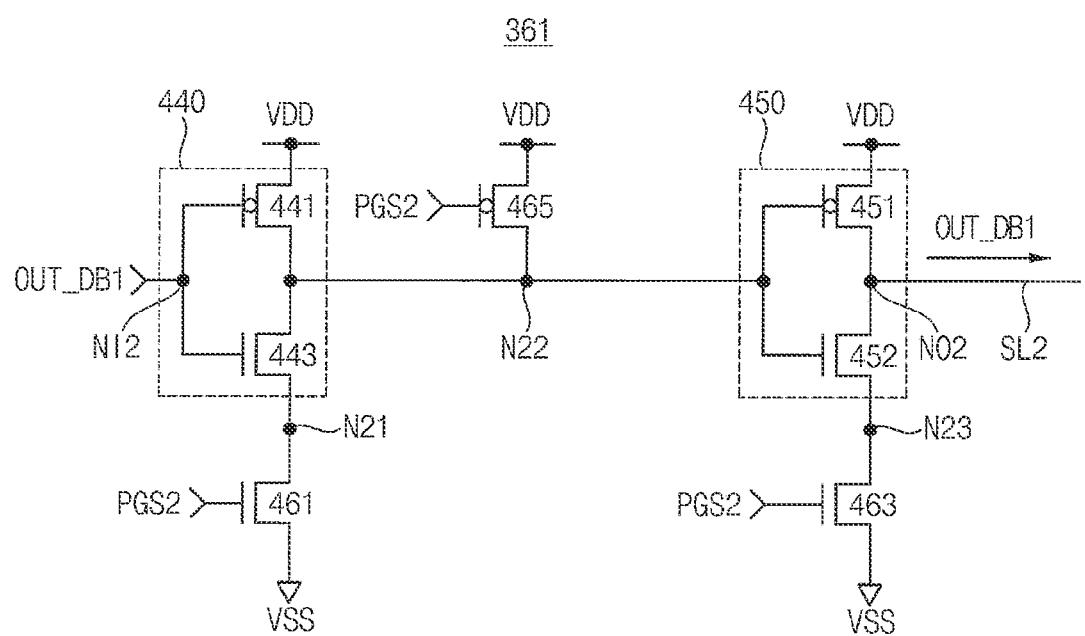
FIG. 11B is a circuit diagram of one of the fourth group of repeaters in the data transfer circuit of FIG. 10 according to exemplary embodiments.

FIG. 11B is a circuit diagram of one of the fourth group of repeaters in the data transfer circuit of FIG. 10 according to exemplary embodiments.

FIG. 11B illustrates a configuration of the repeater 361 of the fourth group of repeaters 361, 362, 363 and 364 and each of the fourth group of repeaters 362, 363 and 364 and the second group of repeaters 321, 322, 323 and 324 may have the same configuration as the repeater 361.

Referring to FIG. 11B, the repeater 361 may include a first inverter 440, a second inverter 450, a first discharge transistor 461, a second discharge transistor 463 and a precharge transistor 465.

The first inverter 440 may be connected between the power supply voltage VDD and a first node N21 and may include a PMOS transistor 441 and an NMOS transistor 443. The PMOS transistor 441 may be connected between the power supply voltage VDD and a second node N22 corresponding to an output of the first inverter 440 and the NMOS transistor 443 may be connected between the second node N22 and the first node N21. Gates of the PMOS transistor 441 and the NMOS transistor 443 may be commonly coupled to an input node NH and may receive an output data bit OUT_DB1.

The first discharge transistor 461 may be connected between the first node N21 and the ground voltage VSS and may include an NMOS transistor that has a drain coupled to the first node N21, a source coupled to the ground voltage VSS and a gate receiving the second power gating signal PGS2. The first discharge transistor 461 may discharge (or, pull-down) the first node N21 to the ground voltage VSS in response to the second power gating signal PGS2 having a logic high level.

The precharge transistor 465 may be connected between the power supply voltage VDD and the second node N22 and may include a PMOS transistor that has a source coupled to the power supply voltage VDD, a drain coupled to the second node N22 and a gate receiving the second power gating signal PGS2. The precharge transistor 465 may precharge (or, pull-up) the second node N22 with the power supply voltage VDD in response to the second power gating signal PGS2 having a logic low level.

The second inverter 450 may be connected between the power supply voltage VDD and a third node N23 and may include a PMOS transistor 451 and an NMOS transistor 453. The PMOS transistor 451 may be connected between the power supply voltage VDD and an output node NO2 coupled to the signal line SL2 and the NMOS transistor 453 may be connected between the output node NO2 and the third node N23. Gates of the PMOS transistor 451 and the NMOS transistor 453 may be commonly coupled to the second node N22 and the second inverter 450 may invert a voltage level of the second node N22 to provide the output data bit OUT_DB1 at the output node NO2.

The second discharge transistor 463 may be connected between the third node N23 and the ground voltage VSS and may include an NMOS transistor that has a drain coupled to the third node N23, a source coupled to the ground voltage VSS and a gate receiving the second power gating signal PGS2. The second discharge transistor 463 may discharge the third node N23 to the ground voltage VSS in response to the second power gating signal PGS2 having a logic high level.

The second power gating signal PGS2 may have a logic low level in the first operation mode and may have a logic low high in the second operation mode. In response to the second power gating signal PGS2 having a logic high level, the first discharge transistor 461 may discharge the first node N21 to the ground voltage VSS and the second discharge transistor 463 may discharge the third node N23 to the ground voltage VSS. Therefore, the first inverter 440 inverts the output data bit OUT_DB1 and the second inverter 450 inverts the voltage level of the second node N22 to provide the output data bit OUT_DB1 at the output node NO2.

Figure 12:
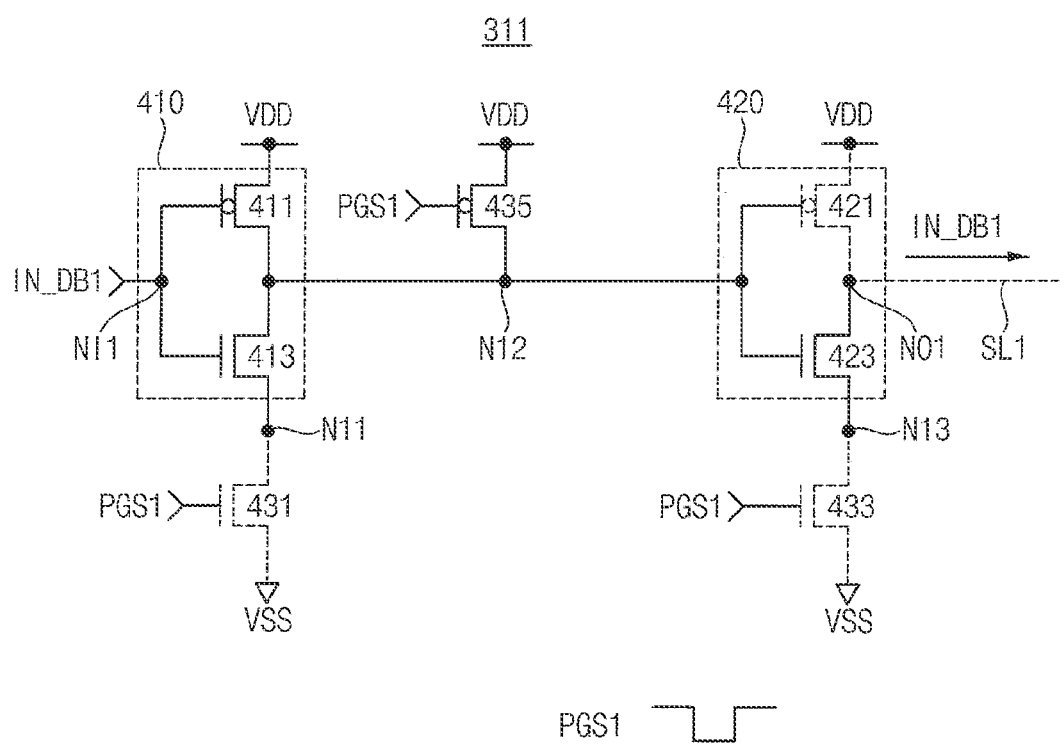
FIG. 12 illustrates an example operation of the repeater of FIG. 11A in the second operation mode according to exemplary embodiments.

FIG. 12 illustrates an example operation of the repeater of FIG. 11A in the second operation mode according to exemplary embodiments.

Referring to FIG. 12, in response to the first power gating signal PGS1 having a logic low level in the second operation mode, the first discharge transistor 431 and the second discharge transistor 433 are turned off and the precharge transistor 435 pulls up the second node N12 with the power supply voltage VDD. The PMOS transistor 421 in the second inverter 420 is turned off in response to a voltage level (e.g., a voltage level of the power supply voltage VDD) of the second node N12. Therefore, the signal line SL1 coupled to the output node NO1 is floated, because the PMOS transistor 421 and the second discharge transistor 433 are turned off. That is, the repeater 311 may float the signal line SL1 coupled to the output node NO1 in response to the first power gating signal PGS1 in the second operation mode.

Similarly, the repeater 361 of FIG. 11B may float the signal line SL2 coupled to the output node NO2 in response to the second power gating signal PGS2 in the first operation mode.

Figure 13:
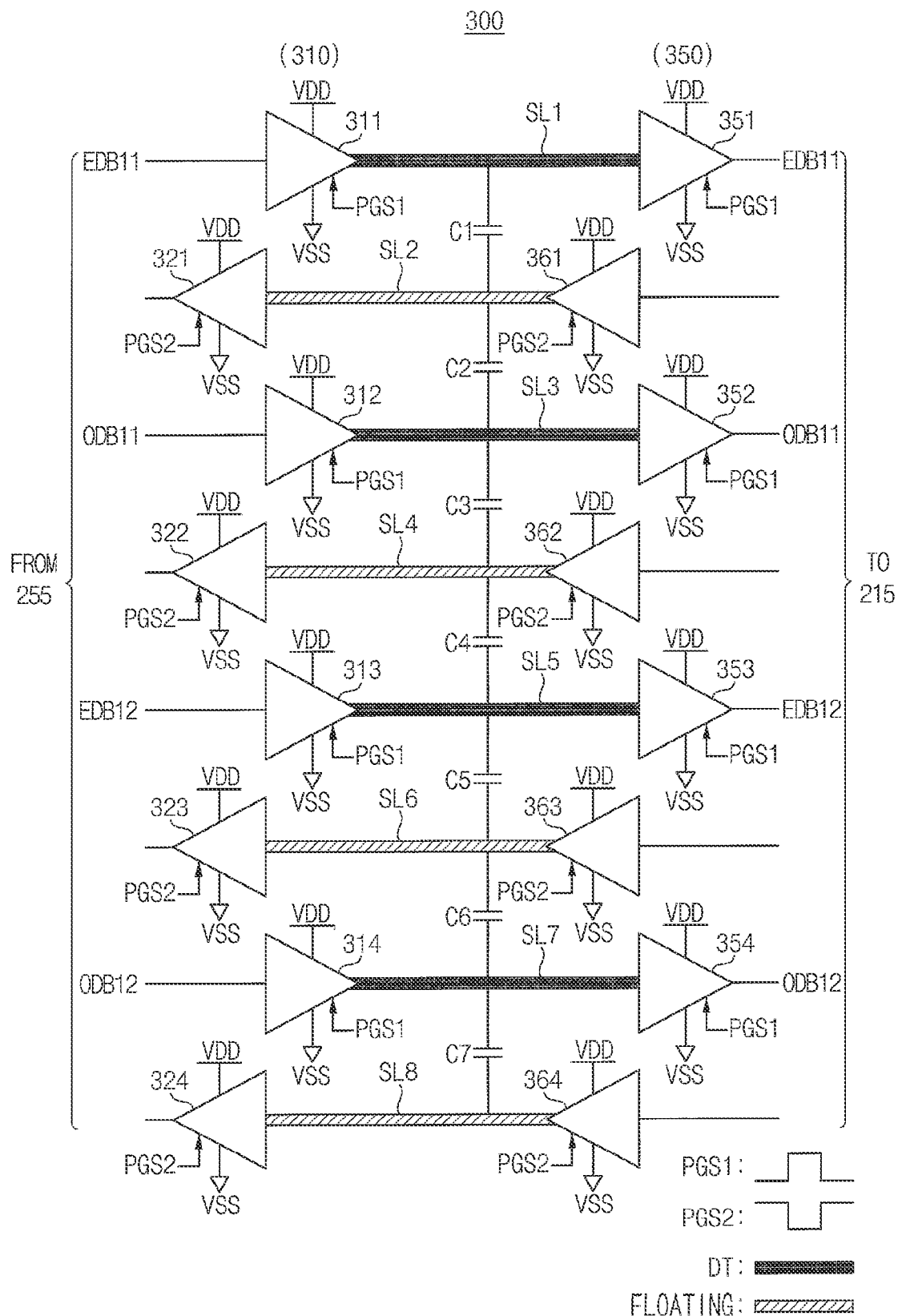
FIG. 13 illustrates an example of the operation of the data transfer circuit of FIG. 10 in the first operation mode according to exemplary embodiments.

FIG. 13 illustrates an example operation of the data transfer circuit of FIG. 10 in the first operation mode according to exemplary embodiments.

Referring to FIG. 13, in the first operation mode, the first power gating signal PGS1 has a logic high level and the second power gating signal PGS2 has a logic low level. Therefore, each of the first group of signal lines SL1, SL3, SL5 and SL7 that connect respective one of the first group of repeaters 311, 312, 313 and 314 with respective one of the third group of repeaters 351, 352, 353 and 354 may transfer respective one of data bits EDB11, ODB11, EDB12 and ODB12 from respective one of the first group of repeaters 311, 312, 313 and 314 to respective one of the third group of repeaters 351, 352, 353 and 354, in response to the first power gating signal PGS1 having a logic high level. In FIG. 13 DT represents 'data transfer'.

In addition, each of the second group of repeaters 321, 322, 323 and 324 and each of the fourth group of repeaters 361, 362, 363 and 364 may float respective one of the second group of signal lines SL2, SL4, SL6 and SL8 coupled to an output of respective one of the fourth group of repeaters 361, 362, 363 and 364 and coupled to an input of respective one of the second group of repeaters 321, 322, 323 and 324 in response to the second power gating signal PGS2 having a logic low level. Therefore, capacitance of each of the first group of signal lines SL1, SL3, SL5 and SL7 transferring respective one of the data bits EDB11, ODB11, EDB12 and ODB12 may be reduced.

A capacitance of the signal line SL1 may have a first value corresponding to a capacitance of serially connected C1 and C2, a capacitance of the signal line SL3 may have a value corresponding to parallel connection of the first value and a second value corresponding to a capacitance of serially connected C3 and C4, a capacitance of the signal line SL5 may have a value corresponding to parallel connection of the second value and a third value corresponding to a capacitance of serially connected C5 and C6 and a capacitance of the signal line SL7 may have a value corresponding to parallel connection of the third value and C7. Therefore, each capacitance of the first group of signal lines SL1, SL3, SL5 and SL7 may be reduced compared with a case when the second group of signal lines SL2, SL4, SL6 and SL8 are not floated.

Figure 14:
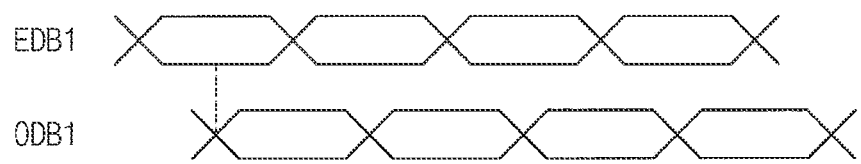
FIG. 14 illustrates an example of data that is transferred to the page buffer circuit when the data transfer circuit operates in the first operation mode.

FIG. 14 illustrates an example in which data that is transferred to the page buffer circuit when the data transfer circuit operates in the first operation mode.

Referring to FIGS. 13 and 14, when the data transfer circuit 300 operates in the first operation mode as illustrated in FIG. 13, even data bits EDB1 transferred to the page buffer circuit 210 through the signal lines SL1 and SL5 may be asynchronized with odd data bits ODB1 transferred to the page buffer circuit 210 through the signal lines SL3 and SL7.

Figure 15:
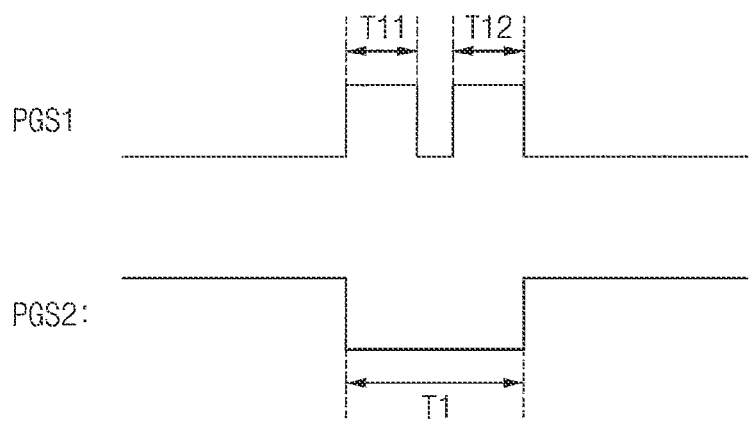
FIG. 15 illustrates an example of the first power gating signal and the second power gating signal when the data transfer circuit transfers data as in FIG. 14.

FIG. 15 illustrates an example of the first power gating signal and the second power gating signal when the data transfer circuit transfers data as in FIG. 14.

Referring to FIG. 15, during an operation interval T1 of the first operation mode, the second power gating signal PGS2 may have a logic low level and the first power gating signal PGS1 may have a logic high level during respective one of first sub interval T11 and a second sub interval T12 within the operation interval T1. Therefore, each of the second group of repeaters 321, 322, 323 and 324 and each of the fourth group of repeaters 361, 362, 363 and 364 may float respective one of the second group of signal lines SL2, SL4, SL6 and SL8. In addition, each of the first group of signal lines SL1, SL3, SL5 and SL7 that connect respective one of the first group of repeaters 311, 312, 313 and 314 with respective one of the third group of repeaters 351, 352, 353 and 354 may transfer asynchronously respective one of data bits EDB11, ODB11, EDB12 and ODB12 from respective one of the first group of repeaters 311, 312, 313 and 314 to respective one of the third group of repeaters 351, 352, 353 and 354.

Figure 16:
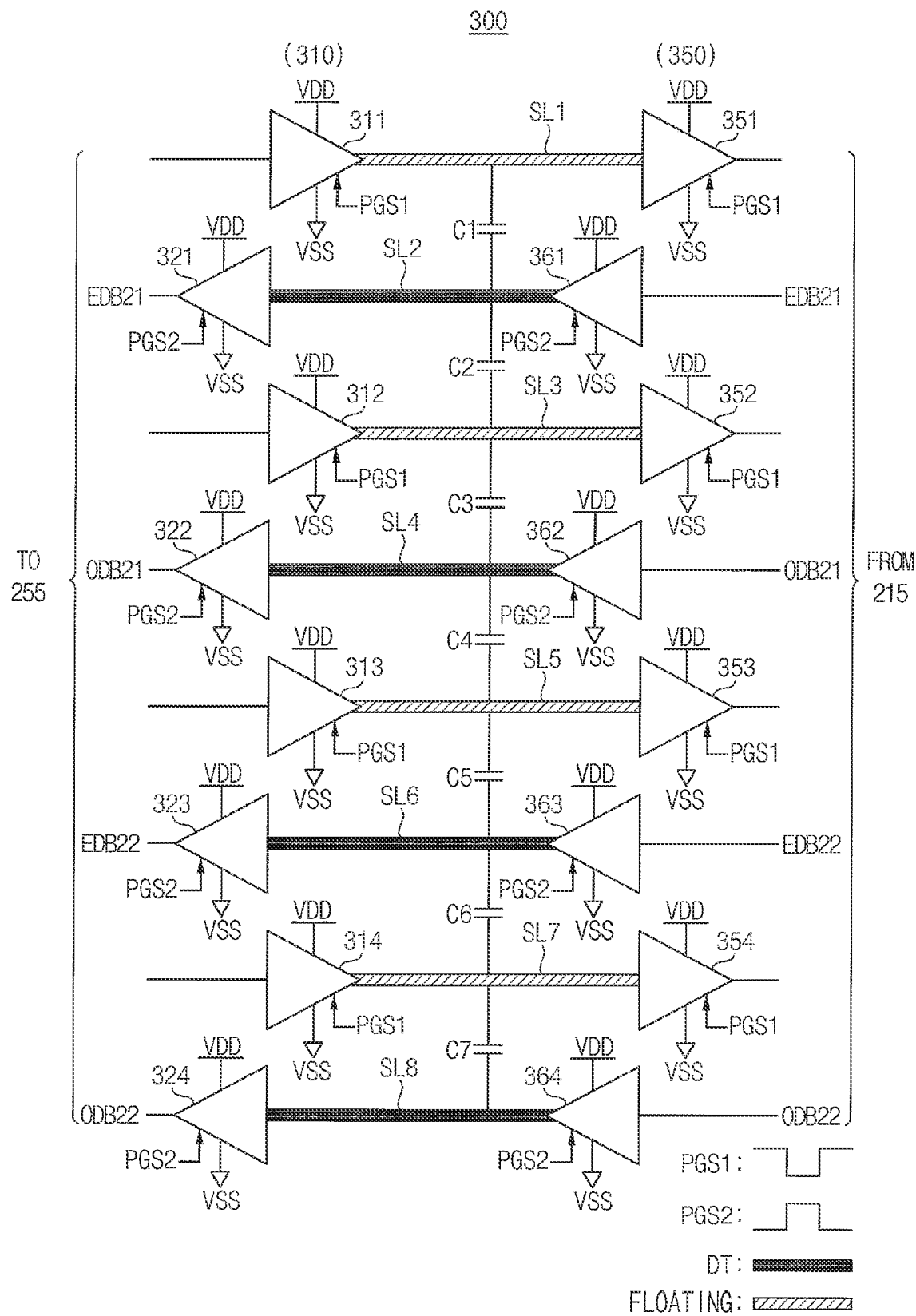
FIG. 16 illustrates an example operation of the data transfer circuit of FIG. 10 in the second operation mode according to exemplary embodiments.

FIG. 16 illustrates an example operation of the data transfer circuit of FIG. 10 in the second operation mode according to exemplary embodiments.

Referring to FIG. 16, in the second operation mode, the first power gating signal PGS1 has a logic low level and the second power gating signal PGS2 has a logic high level. Therefore, each of the second group of signal lines SL2, SL4, SL6 and SL8 that connect respective one of the fourth group of repeaters 361, 362, 363 and 364 with respective one of the second group of repeaters 321, 322, 323 and 324 may transfer respective one of data bits EDB21, ODB21, EDB22 and ODB22 from respective one of the fourth group of repeaters 361, 362, 363 and 364 to respective one of the second group of repeaters 321, 322, 323 and 324, in response to the second power gating signal PGS2 having a logic high level. In FIG. 16 DT represents 'data transfer'.

In addition, each of the first group of repeaters 311, 312, 313 and 314 and each of the third group of repeaters 351, 352, 353 and 354 may float respective one of the first group of signal lines SL1, SL3, SL5 and SL7 coupled to an output of respective one of the first group of repeaters 311, 312, 313 and 314 and coupled to an input of respective one of the third group of repeaters 351, 352, 353 and 354 in response to the second power gating signal PGS2 having a logic low level. Therefore, capacitance of each of the second group of signal lines SL2, SL4, SL6 and SL8 transferring respective one of the data bits EDB21, ODB21, EDB22 and ODB22 may be reduced.

A capacitance of the signal line SL2 may have a value corresponding to parallel connection of C1 and a first value corresponding to a capacitance of serially connected C2 and C3, a capacitance of the signal line SL4 may have a value corresponding to parallel connection of the first value and a second value corresponding to a capacitance of serially connected C4 and C5, a capacitance of the signal line SL6 may have a value corresponding to parallel connection of the second value and a third value corresponding to a capacitance of serially connected C6 and C7 and a capacitance of the signal line SL8 may correspond to the third value. Therefore, each capacitance of the second group of signal lines SL2, SL4, SL6 and SL8 may be reduced compared with a case when the first group of signal lines SL1, SL3, SL5 and SL7 are not floated.

Figure 17:
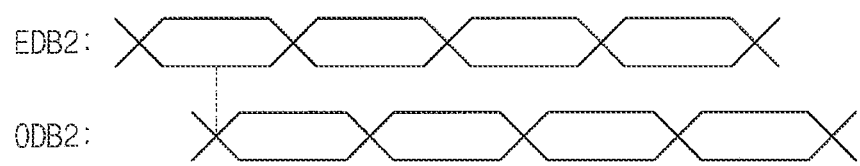
FIG. 17 illustrates an example of data that is transferred to the data I/O circuit when the data transfer circuit operates in the second operation mode.

FIG. 17 illustrates an example in which data that is transferred to the data I/O circuit when the data transfer circuit operates in the second operation mode.

Referring to FIGS. 16 and 17, when the data transfer circuit 300 operates in the second operation mode as illustrated in FIG. 16, even data bits EDB2 transferred to the data I/O circuit 250 through the signal lines SL2 and SL6 may be asynchronized with odd data bits ODB2 transferred to the data I/O circuit 250 through the signal lines SL4 and SL8.

Figure 18:
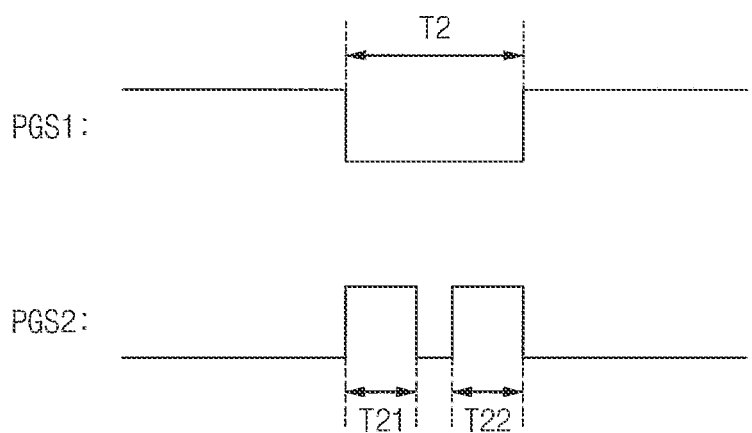
FIG. 18 illustrates an example of the first power gating signal and the second power gating signal when the data transfer circuit transfers data as in FIG. 17.

FIG. 18 illustrates an example of the first power gating signal and the second power gating signal when the data transfer circuit transfers data as in FIG. 17.

Referring to FIG. 18, during an operation interval T2 of the second operation mode, the first power gating signal PGS1 may have a logic low level and the second power gating signal PGS2 may have a logic high level during respective one of first sub interval T21 and a second sub interval T22 within the operation interval T2. Therefore, each of the first group of repeaters 311, 312, 313 and 314 and each of the third group of repeaters 351, 352, 353 and 354 may float respective one of the first group of signal lines SL1, SL3, SL5 and SL7. In addition, each of the second group of signal lines SL2, SL4, SL6 and SL8 that connect respective one of the fourth group of repeaters 361, 362, 363 and 364 with respective one of the second group of repeaters 321, 322, 323 and 324 may transfer respective one of data bits EDB21, ODB21, EDB22 and ODB22 from respective one of the fourth group of repeaters 361, 362, 363 and 364 to respective one of the second group of repeaters 321, 322, 323 and 324.

Figure 19:
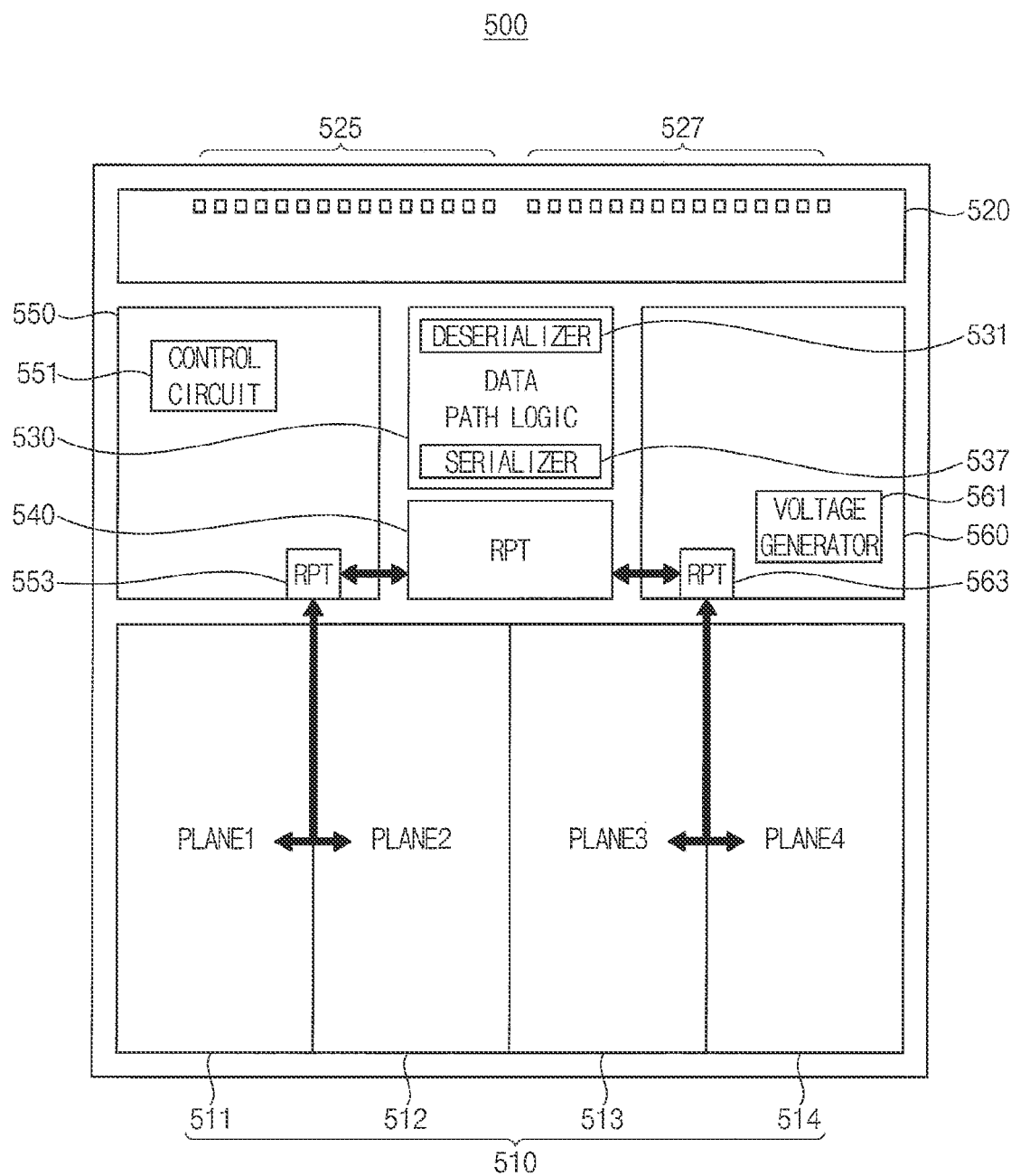
FIG. 19 is a block diagram illustrating an example of a nonvolatile memory device according to exemplary embodiments.

FIG. 19 is a block diagram illustrating an example of a nonvolatile memory device according to exemplary embodiments.

FIG. 19 illustrates an internal layout of a nonvolatile memory device 500.

Referring to FIG. 19, the nonvolatile memory device 500 may include a plurality of memory planes 511, 512, 513 and 514. Each of the memory planes 511, 512, 513 and 514 may include a plurality of memory blocks. Each of the memory planes 511, 512, 513 and 514 may form a memory cell array 510. A peripheral region may be formed adjacent to one side of the memory cell array 510. The peripheral region may include a data path logic 530, a repeater (RPT) 540, a first region 550, a second region 560, and so forth. An interface region 520 may be formed adjacent to one side of the peripheral region. The first region may include a control circuit 551 and the second region 560 may include a voltage generator 561.

The data path logic 530 may be disposed between the interface region 220 and the memory cell array 510. The data path logic 530 may include a deserializer 531 and a serializer 537 which are referred to as a 'SERDES', and may receive data from data I/O pads 525 and 527 included in the interface region 520 or output data to the data I/O pads 525 and 527.

In exemplary embodiments, the memory cell array 510 may be provided in the first semiconductor layer L1 in FIG. 3 and the peripheral region may be provided in the second semiconductor layer L2 in FIG. 3.

Referring to FIG. 19, data transmission from the repeater 540 is designated by arrows. If data is inputted through the data I/O pads 525 and 527 in the interface region 520, the data is transmitted to the data path logic 530. The data is processed by the SERDES and then transmitted to the repeater 540. The repeater 240 may transmit data to a repeater 553 in the first region 550 or a repeater 563 in the second region 560. The repeaters 553 and 563 may transmit the received data to the memory planes 511, 512, 513 and 514 in the memory cell array 510. Data transmitted from the memory planes 511, 512, 513 and 514 may be transmitted to the I/O pads 525 and 527 of the interface region 520 in a reverse direction of the above-mentioned process.

Figure 20:
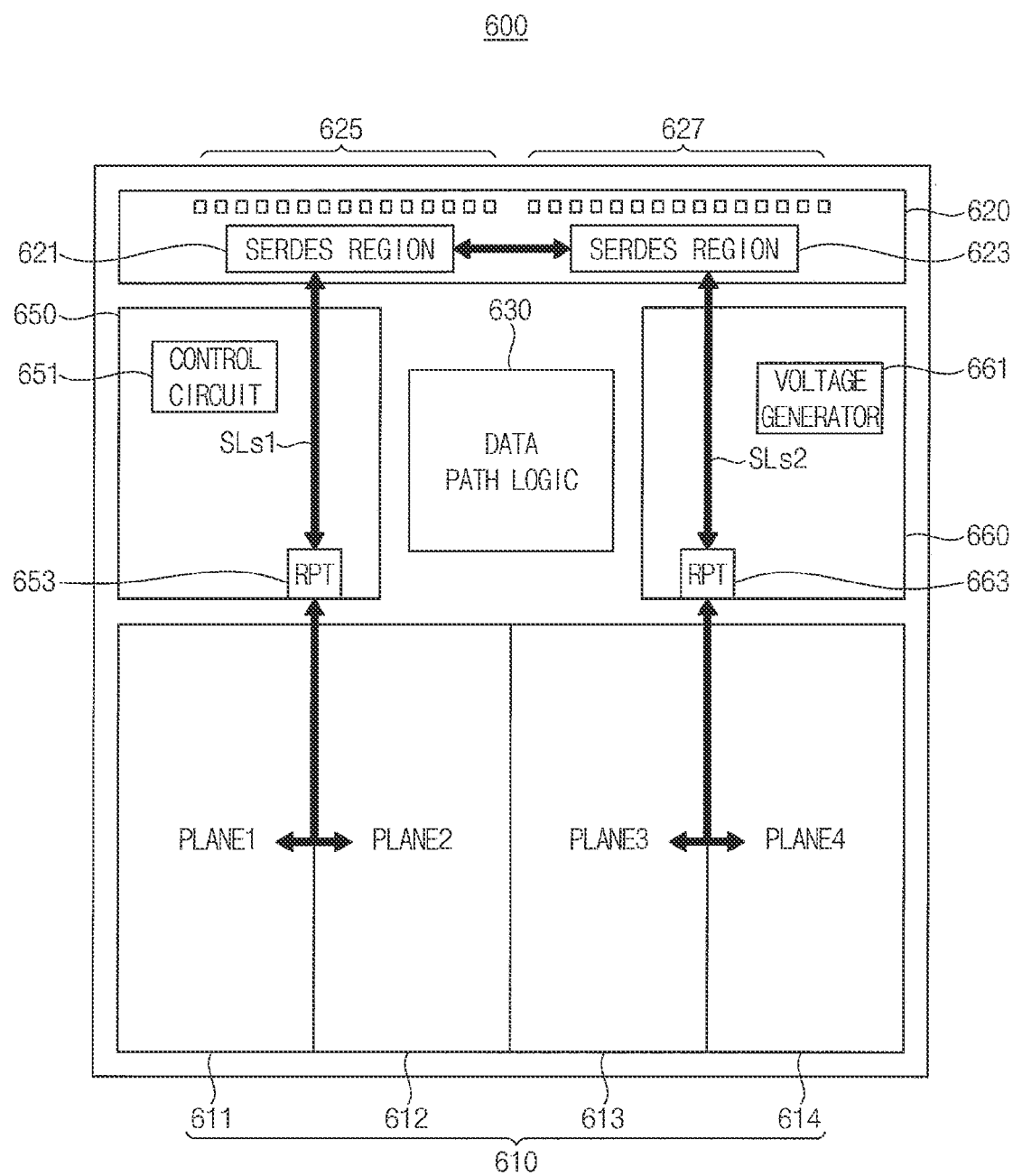
FIG. 20 is a block diagram illustrating an example of a nonvolatile memory device according to exemplary embodiments.

FIG. 20 is a block diagram illustrating an example of a nonvolatile memory device according to exemplary embodiments.

Referring to FIG. 20, the nonvolatile memory device 600 may include a plurality of memory planes 611, 612, 613 and 614. Each of the memory planes 611, 612, 613 and 614 may include a plurality of memory blocks. Each of the memory planes 611, 612, 613 and 614 may form a memory cell array 610. A peripheral region may be formed adjacent to one side of the memory cell array 610. The peripheral region may include a data path logic 630, a first region 550, a second region 660, and so forth. An interface region 620 may be formed adjacent to one side of the peripheral region.

The first region may include a control circuit 651 and a repeater 653 and the second region 660 may include a voltage generator 561 and a repeater 663.

The interface region 620 may include SERDES regions 621 and 623 and data I/O pads 625 and 627. The SERDES regions 621 and 623 may include a serializer and a deserializer. In FIG. 20, thick arrows represent a data transfer path. In other words, data inputted through a data I/O pads 625 and 627 in the interface region 620 may be processed by the serializer and a deserializer in the SERDES regions 621 and 623 and then transmitted to the repeaters 653 and 663 through signal lines SLs1 and SLs2. The repeaters 653 and 663 may transmit the received data to the memory planes 611, 612, 613 and 614.

Repeaters provided in the SERDES regions 621 and 623, the signal lines SLs1 and SLs2 and the repeaters 653 and 663 may have corresponding configurations in FIG. 10. Therefore, repeaters coupled to the signal lines that do not transfer data float the signal lines in response to the power gating signal and may reduce power consumed in the signal lines.

Figure 21:
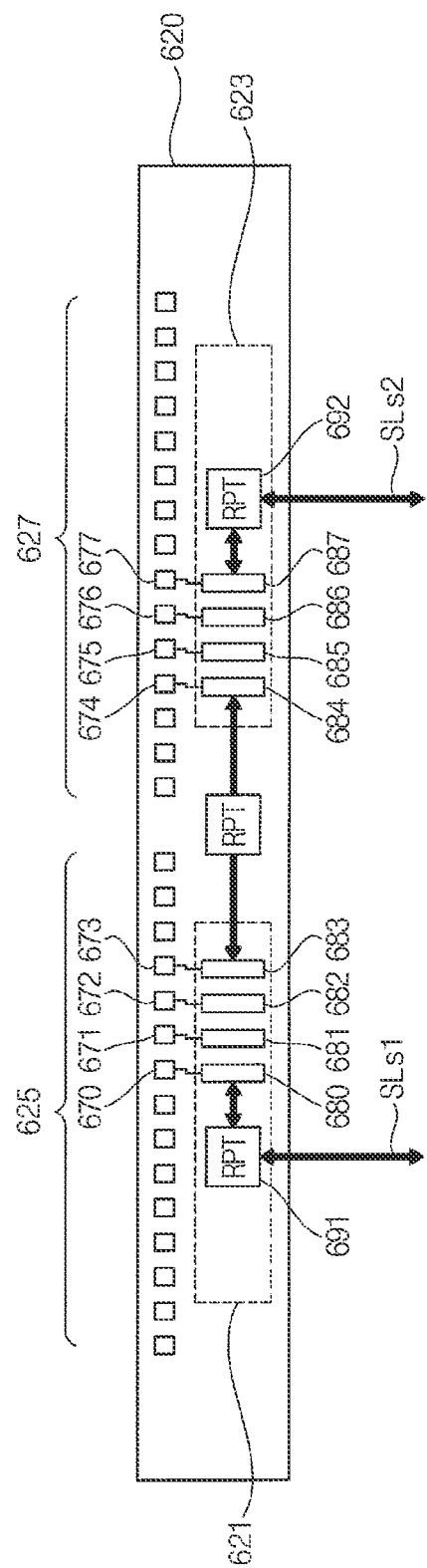
FIG. 21 illustrates the interface region in the nonvolatile memory device of FIG. 20.

FIG. 21 illustrates the interface region in the nonvolatile memory device of FIG. 20.

Referring to FIG. 21, the interface region may include the SERDES regions 621 and 623. The data I/O pads 625 and 627 may include data I/O pads 670, 671, 672, 673, 674, 675, 676 and 677. The SERDES regions 621 and 623 may include a plurality of SEEDRSs 680, 681, 682, 683, 684, 685, 686 and 687.

Each of the SEEDRSs 680, 681, 682, 683, 684, 685, 686 and 687 may be coupled with a corresponding data I/O pads 670, 671, 672, 673, 674, 675, 676 and 677.

Each of the SERDES regions 621 and 623 may include a respective one of repeaters 691 and 692 and the interface region 620 may further include a repeater 693.

Of data inputted to the data I/O pads 670, 671, 672 and 673 disposed at the left side of the interface region 620, data to be transmitted to the memory planes 613 and 614 may be processed by the SERDESs 680, 681, 682 and 683 of the SERDES region 621 disposed adjacent to the data I/O pads 670, 671, 672 and 673, and then transmitted to the repeater 692 through the repeater 693. The data may then be transmitted to the memory planes 613 and 614 through the repeater 663.

Of the data inputted to the data I/O pads 670, 671, 672 and 673 disposed at the left side of the interface region 620, data to be transmitted to the memory planes 611 and 612 may be processed by the SERDESs 680, 681, 682 and 683 of the SERDES region 621 disposed adjacent to the data I/O pads 670, 671, 672 and 673, and then transmitted to the repeater 691. The data may then be transmitted to the memory planes 611 and 612 through the repeater 653.

Figure 22:
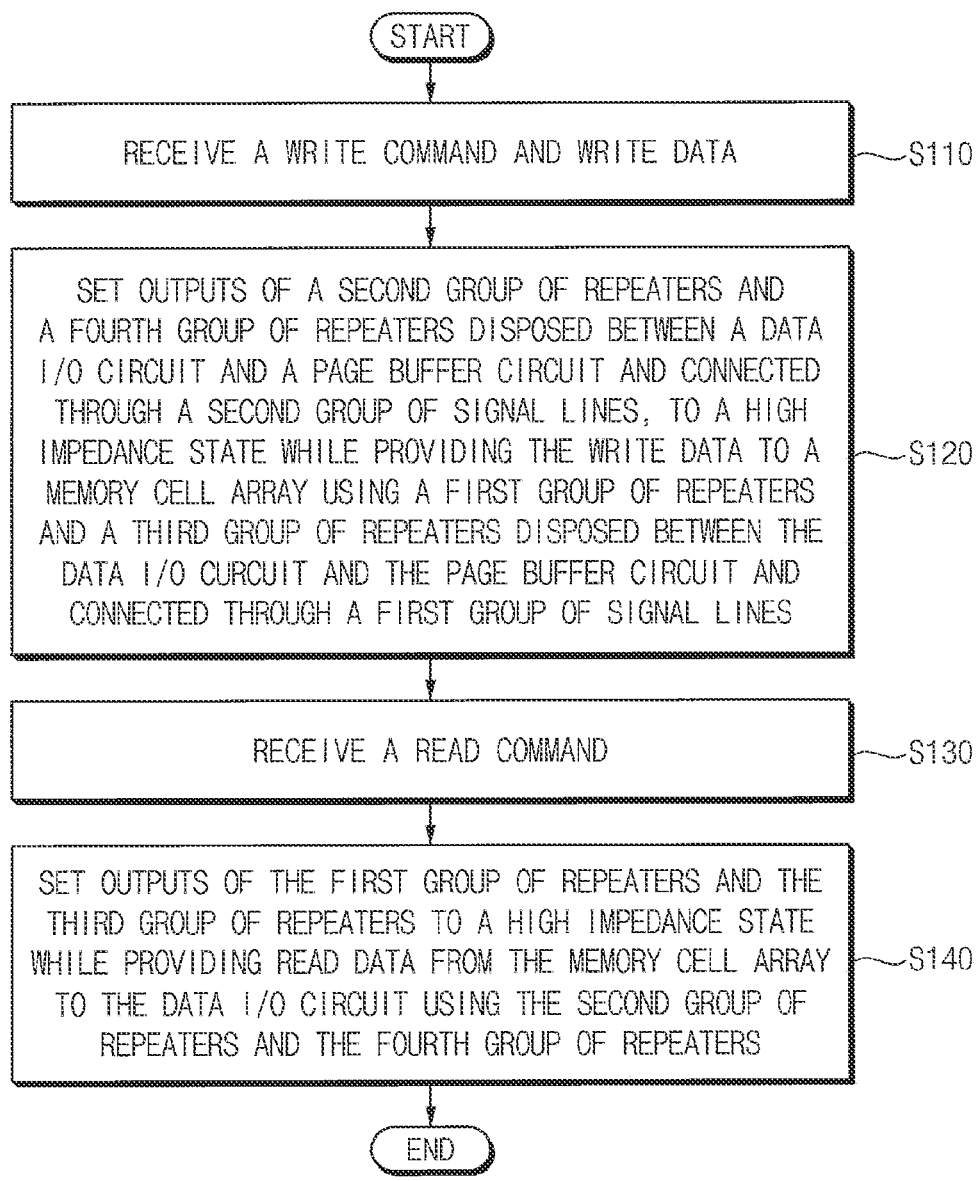
FIG. 22 is a flow chart illustrating a method of operating a nonvolatile memory device according to exemplary embodiments.

FIG. 22 is a flow chart illustrating a method of operating a nonvolatile memory device according to exemplary embodiments.

Referring to FIGS. 1 through 18 and 22, the nonvolatile memory device 50 receives a write command and a write data from the memory controller 20 (operation S110).

The control circuit 220 floats the second group of signal lines SL2, SL4, SL6 and SL8 coupled to an output of respective one of the fourth group of repeaters 361, 362, 363 and 364 and coupled to an input of respective one of the second group of repeaters 321, 322, 323 and 324 by setting inputs of the second group of repeaters 321, 322, 323 and 324 and outputs of the fourth group of repeaters 361, 362, 363 and 364 to a high impedance state while providing the write data to the memory cell array 100 through page buffer circuit 210 using the first group of repeaters 311, 312, 313 and 314 and the third group of repeaters 351, 352, 353 and 354 coupled through the first group of signal lines SL1, SL3, SL5 and SL7 (operation S120).

The nonvolatile memory device 50 receives a read command from the memory controller 20 (operation S130).

The control circuit 220 floats the first group of repeaters 311, 312, 313 and 314 by setting outputs of the first group of repeaters 311, 312, 313 and 314 and inputs of the third group of repeaters 351, 352, 353 and 354 to a high impedance state while providing the read data read from the memory cell array 100 to the data I/O circuit 250 using the second group of repeaters 321, 322, 323 and 324 and the fourth group of repeaters 361, 362, 363 and 364 coupled through the second group of signal lines SL2, SL4, SL6 and SL8 (operation S140).

Therefore, the data transfer circuit 300 and the nonvolatile memory device 50 may transfer data to the page buffer circuit through the first group of signal lines while floating the second group of signal lines which are alternatingly arranged with the first group of signal lines using the second group of repeaters and the fourth group of repeaters in the first operation mode, may transfer data to the data I/O circuit through the second group of signal lines while floating the first group of signal lines using the first group of repeaters and the third group of repeaters in the second operation mode and may reduce power consumption by reducing capacitance of the signal lines transferring data.

Figure 23:
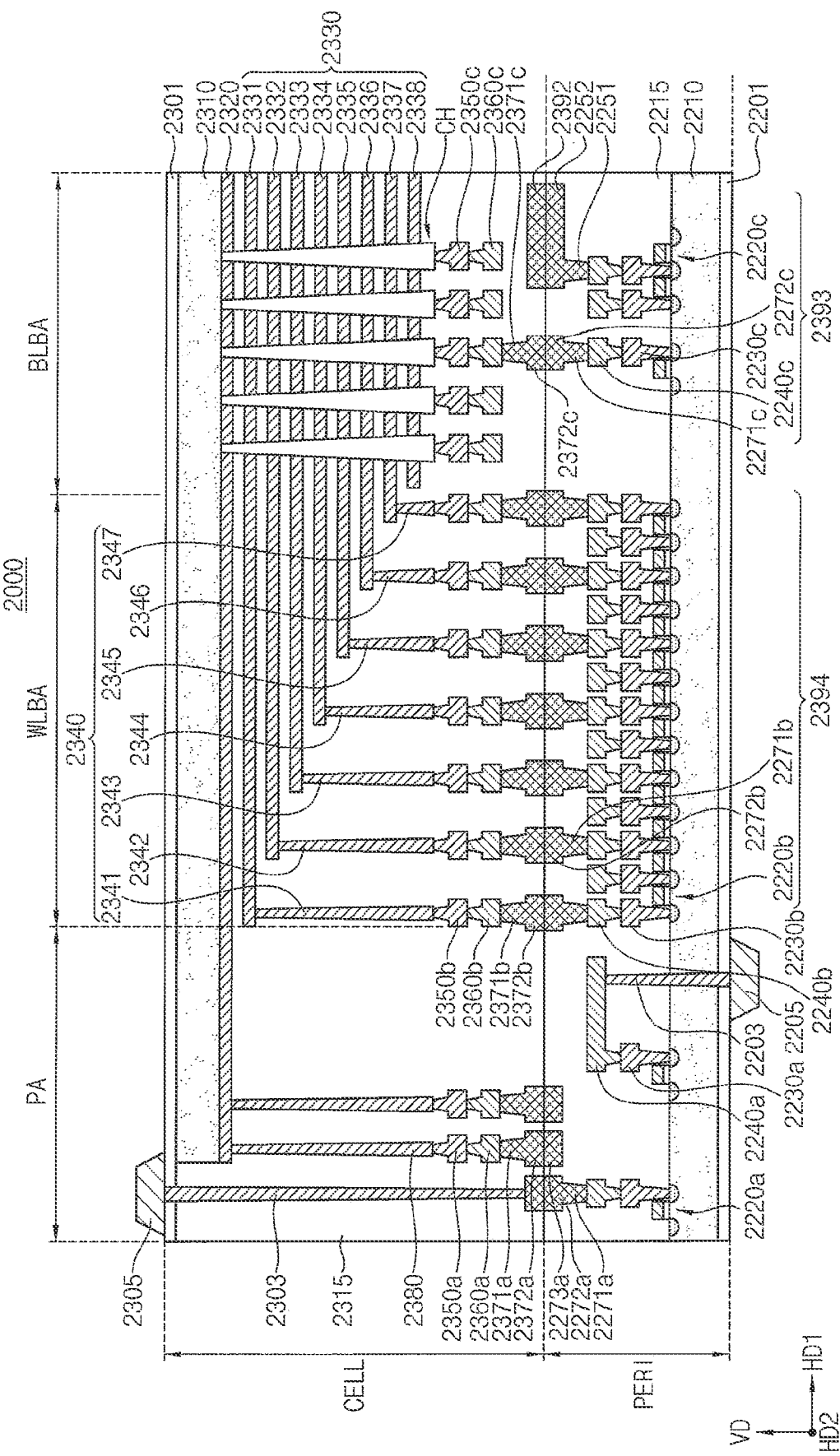
FIG. 23 is a cross-sectional view of a nonvolatile memory device according to exemplary embodiments.

FIG. 23 is a cross-sectional view of a nonvolatile memory device according to exemplary embodiments.

Referring to FIG. 23, a nonvolatile memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The exemplary embodiment, however, may not be limited thereto. For example, the bonding metals may also be formed of aluminum (Al) or tungsten (W).

Each of the peripheral circuit region PERI and the cell region CELL of the nonvolatile memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an exemplary embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an exemplary embodiment illustrated in FIG. 23, although only the first metal layers 2230a, 2230b, and 2230c and the second metal layers 2240a, 2240b, and 2240c are shown and described, the exemplary embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (i.e., 2330) may be stacked in a vertical direction VD (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit-line contact, and the second metal layer 2360c may be a bit-line. In an exemplary embodiment, the bit-line 2360c may extend in a second horizontal direction HD2 (e.g., a Y-axis direction), parallel to the upper surface of the second substrate 2310.

In an exemplary embodiment illustrated in FIG. 23, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2341, 2342, 2343, 2344, 2345, 2346, and 2347 (i.e., 2340). The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In an exemplary embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303 and/or lower bonding metals 2271a and 2272a, and the like. In the exemplary embodiment, the second input/output pad 2305 is electrically connected to a circuit element 2220a.

According to exemplary embodiments, the second substrate 2310 and the common source line 2320 may not be disposed in an area in which the second input/output contact plug 2303 is disposed. Also, the second input/output pad 2305 may not overlap the word-lines 2330 in the vertical direction VD. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to exemplary embodiments, the first input/output pad 2205 and the second input/output pad 2305 may be selectively formed. For example, the nonvolatile memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided in an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the nonvolatile memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL. The upper metal pattern 2372a may be included in upper bonding metals 2371a and 2372a.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may be omitted on the upper metal pattern 2392 formed in the uppermost metal layer of the cell region CELL. The lower metal pattern 2252 may be included in lower bonding metals 2251 and 2252.

In an exemplary embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may be omitted on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL.

A page buffer circuit including the page buffer PB of FIG. 8 may be provided in the peripheral circuit region PERI using at least a portion of the plurality of circuit elements 2220a, 2220b and 2220c.

Figure 24:
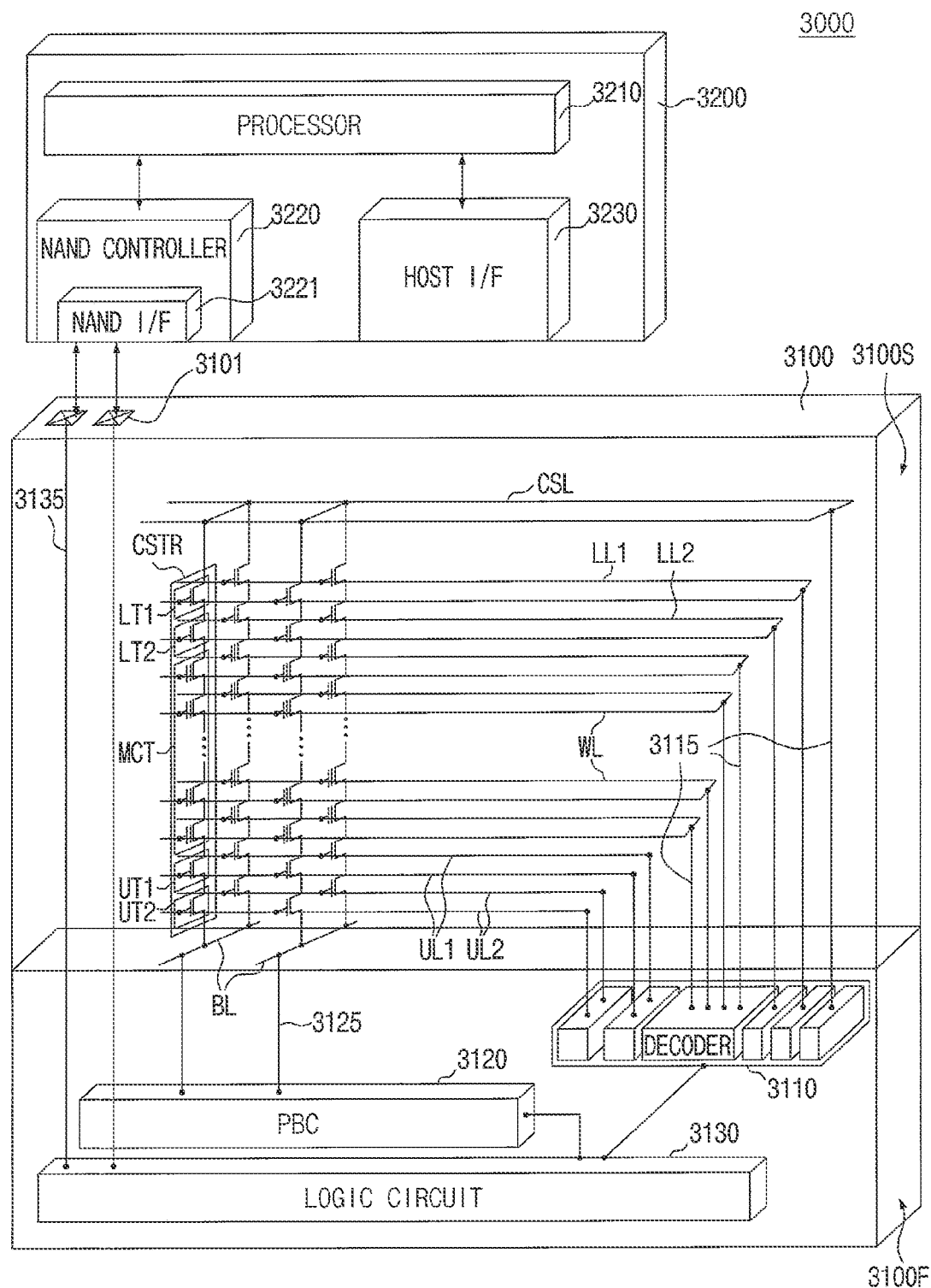
FIG. 24 is a block diagram illustrating an electronic system including a semiconductor device according to exemplary embodiments.

FIG. 24 is a block diagram illustrating an electronic system including a semiconductor device according to exemplary embodiments.

Referring to FIG. 24, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD)

device, a universal serial bus (USB), a computing system, a medical device, or a communication device that may include one or a plurality of semiconductor devices 3100.

The semiconductor device 3100 may be a nonvolatile memory device, for example, a nonvolatile memory device that will be illustrated with reference to FIGS. 1 through 21. The semiconductor device 3100 may include a first structure 3100F and a second structure 3100S on the first structure 3100E The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with exemplary embodiments.

In exemplary embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In further exemplary embodiments, the lower transistors LT1 and LT2 may include a lower erase control transistor LT1 and a ground selection transistor LT2 that may be connected with each other in series. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 3115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an external host. When control command is received from the external host through the host interface 3230, the processor 3210 may control the semiconductor device 3100 in response to the control command.

A nonvolatile memory device or a storage device according to exemplary embodiments may be packaged using various package types or package configurations.

The foregoing is illustrative of exemplary embodiments and is not to be construed as limiting thereof. Although a few exemplary embodiments have been described, those skilled in the art will readily appreciate that many modifications and variants are possible in such exemplary embodiments without materially departing from the novel teachings and advantages of the present disclosure. Accordingly, all such modifications and variations are intended to be included within the scope of the present disclosure as defined in the appended claims.

What is claimed is:

1. A data transfer circuit in a nonvolatile memory device, the data transfer circuit comprising:
a plurality of first repeaters connected to a first circuit element disposed in a data input/output (I/O) path of the nonvolatile memory device;
a plurality of second repeaters connected to a second circuit element disposed in the data I/O path of the nonvolatile memory device, the second circuit element being spaced apart from the first circuit element; and
a plurality of signal lines configured to connect the plurality of first repeaters and the plurality of second repeaters, the plurality of signal lines including a first group of signal lines and a second group of signal lines which are alternatingly arranged,
wherein the plurality of first repeaters include:
a first group of repeaters that are activated in a first operation mode; and
a second group of repeaters that are activated in a second operation mode having a non-overlapping operating interval with the first operation mode,
wherein the plurality of second repeaters include:
a third group of repeaters that are activated in the first operation mode and are connected to the first group of repeaters through the first group of signal lines; and
a fourth group of repeaters that are activated in the second operation mode and are connected to the second group of repeaters through the second group of signal lines,
wherein the second group of signal lines are floated in the first operation mode, and wherein the first group of signal lines are floated in the second operation mode.

2. The data transfer circuit of claim 1, wherein, in the second operation mode,
the first group of repeaters are configured to float an output node coupled to the first group of signal lines in response to a first power gating signal; and
the third group of repeaters are configured to float an input node coupled to the first group of signal lines in response to the first power gating signal.

3. The data transfer circuit of claim 1, wherein, in the first operation mode,
the second group of repeaters are configured to float an output node coupled to the second group of signal lines in response to a second power gating signal; and
the fourth group of repeaters are configured to float an input node coupled to the second group of signal lines in response to the second power gating signal.

4. The data transfer circuit of claim 1, wherein each of the first group of repeaters and the third group of repeaters includes:
a first inverter connected between a power supply voltage and a first node;
a first discharge transistor connected between the first node and a ground voltage, the first discharge transistor having a gate to receive a first power gating signal;
a precharge transistor connected between the power supply voltage and a second node corresponding to an output of the first inverter, the precharge transistor having a gate to receive the first power gating signal;
a second inverter connected between the second node and an output node and between the power supply voltage and a third node; and
a second discharge transistor connected between the third node and the ground voltage, the second discharge transistor having a gate to receive the first power gating signal.

5. The data transfer circuit of claim 4, wherein, in response to the first power gating signal having a logic high level in the first operation mode,
the first discharge transistor is configured to discharge the first node to the ground voltage, and
the second discharge transistor is configured to discharge the third node to the ground voltage.

6. The data transfer circuit of claim 4, wherein the first inverter includes:
a first p-channel metal-oxide semiconductor (PMOS) transistor connected between the power supply voltage and the second node; and
a first n-channel metal-oxide semiconductor (NMOS) transistor connected between the second node and the first node,
wherein the second inverter includes:
a second PMOS transistor connected between the power supply voltage and the output node; and
a second NMOS transistor connected between the output node and the third node, and
wherein the first power gating signal has a logic low level in the second operation mode.

7. The data transfer circuit of claim 6, wherein in response to the first power gating signal having a logic low level in the second operation mode,
the precharge transistor is configured to precharge the second node with the power supply voltage, and
the first NMOS transistor and the second NMOS transistor are turned off, and the second PMOS transistor is turned off in response to a voltage level of the second node to float the output node coupled to a corresponding signal line from among the first group of signal lines.

8. The data transfer circuit of claim 1, wherein each of the second group of repeaters and the fourth group of repeaters includes:
a first inverter connected between a power supply voltage and a first node;
a first discharge transistor connected between the first node and a ground voltage, the first discharge transistor having a gate to receive a second power gating signal;
a precharge transistor connected between the power supply voltage and a second node corresponding to an output of the first inverter, the precharge transistor having a gate to receive the second power gating signal;
a second inverter connected between the second node and an output node and between the power supply voltage and a third node; and
a second discharge transistor connected between the third node and the ground voltage, the second discharge transistor having a gate to receive the second power gating signal.

9. The data transfer circuit of claim 8, wherein, in response to the second power gating signal having a logic high level in the second operation mode,
the first discharge transistor is configured to connect the first node to the ground voltage, and
the second discharge transistor is configured to connect the third node to the ground voltage.

10. The data transfer circuit of claim 8, wherein the first inverter includes:
a first p-channel metal-oxide semiconductor (PMOS) transistor connected between the power supply voltage and the second node; and
a first n-channel metal-oxide semiconductor (NMOS) transistor connected between the second node and the first node,
wherein the second inverter includes:
a second PMOS transistor connected between the power supply voltage and the output node; and
a second NMOS transistor connected between the output node and the third node, and
wherein the second power gating signal has a logic low level in the first operation mode.

11. The data transfer circuit of claim 10, wherein in response to the second power gating signal having a logic low level in the first operation mode,
the precharge transistor is configured to precharge the second node with the power supply voltage, and
the first NMOS transistor and the second NMOS transistor are turned off, and
the second PMOS transistor is turned off in response to a voltage level of the second node to float the output node coupled to a corresponding signal line from among the second group of signal lines.

12. The data transfer circuit of claim 1, wherein:
the first circuit element includes a data input/output circuit configured to transmit/receive data to/from an external memory controller; and
the second circuit element includes a page buffer circuit coupled to a memory cell array including a plurality of memory blocks through a plurality of bit-lines.

13. A nonvolatile memory device comprising:
a memory cell array including a plurality of memory cells;
a page buffer circuit coupled to the memory cell array through a plurality of bit-lines;

a data input/output (I/O) circuit configured to transmit/receive data to/from an external memory controller;
a data transfer circuit (i) comprising a plurality of first repeaters connected to the data I/O circuit and (ii) connected between the page buffer circuit and the data I/O circuit, configured to:
provide the data from the data I/O circuit to the page buffer circuit in a first operation mode; and
provide the data from the page buffer circuit to the data I/O circuit in a second operation mode having a non-overlapping operating interval with the first operation mode; and
a control circuit configured to control the page buffer circuit and the data transfer circuit,
wherein the data transfer circuit is configured to float a portion of signal lines that do not transfer the data, from among a plurality of signal lines included therein, in response to a first power gating signal and a second power gating signal from the control circuit in each of the first operation mode and the second operation mode, and
wherein the plurality of first repeaters include a first group of repeaters that are activated in the first operation mode and a second group of repeaters that are activated in the second operation mode.

14. The nonvolatile memory device of claim 13, wherein the data transfer circuit includes:
a plurality of second repeaters connected to the page buffer circuit; and
a plurality of signal lines configured to connect the plurality of first repeaters and the plurality of second repeaters, the plurality of signal lines including a first group of signal lines and a second group of signal lines which are alternatingly arranged,
wherein the plurality of second repeaters include:
a third group of repeaters that are activated in the first operation mode and are connected to the first group of repeaters through the first group of signal lines; and
a fourth group of repeaters that are activated in the second operation mode and are connected to the second group of repeaters through the second group of signal lines,
wherein the second group of signal lines are floated in the first operation mode, and
wherein the first group of signal lines are floated in the second operation mode.

15. The nonvolatile memory device of claim 14, wherein, in the second operation mode,
the first group of repeaters are configured to float a first output node coupled to the first group of signal lines in response to the first power gating signal; and
the third group of repeaters are configured to float an input node coupled to the first group of signal lines in response to the first power gating signal, and
wherein, in the first operation mode,
the second group of repeaters are configured to float a second output node coupled to the second group of signal lines in response to the second power gating signal; and
the fourth group of repeaters are configured to float an input node coupled to the second group of signal lines in response to the second power gating signal.

16. The nonvolatile memory device of claim 14, wherein each of the first group of repeaters and the third group of repeaters includes:

a first inverter connected between a power supply voltage and a first node;
a first discharge transistor connected between the first node and a ground voltage, the first discharge transistor having a gate to receive a first power gating signal;
a precharge transistor connected between the power supply voltage and a second node corresponding to an output of the first inverter, the precharge transistor having a gate to receive the first power gating signal;
a second inverter connected between the second node and an output node and between the power supply voltage and a third node; and
a second discharge transistor connected between the third node and the ground voltage, the second discharge transistor having a gate to receive the first power gating signal.

17. The nonvolatile memory device of claim 14, wherein each of the second group of repeaters and the fourth group of repeaters includes:
a first inverter connected between a power supply voltage and a first node;
a first discharge transistor connected between the first node and a ground voltage, the first discharge transistor having a gate to receive the second power gating signal;
a precharge transistor connected between the power supply voltage and a second node corresponding to an output of the first inverter, the precharge transistor having a gate to receive the second power gating signal;
a second inverter connected between the second node and an output node and between the power supply voltage and a third node; and
a second discharge transistor connected between the third node and the ground voltage, the second discharge transistor having a gate to receive the second power gating signal.

18. The nonvolatile memory device of claim 13, wherein the page buffer circuit includes:
a plurality of page buffer units being disposed in a first horizontal direction; and
a plurality of cache latches being spaced apart from the plurality of page buffer units in the first horizontal direction, the plurality of cache latches respectively corresponding to the plurality of page buffer units, the plurality of cache latches commonly connected to a combined sensing node,
wherein each of the plurality of page buffer units includes a pass transistor connected to each sensing node and driven in response to a pass control signal.

19. The nonvolatile memory device of claim 13, wherein:
the memory cell array is disposed on a first semiconductor layer;
the page buffer circuit, the data I/O circuit and the data transfer circuit are disposed on a second semiconductor layer; and
the first semiconductor layer and the second semiconductor layer are vertically stacked.

20. A data transfer circuit in a nonvolatile memory device, the data transfer circuit comprising:
a plurality of first repeaters connected to a first circuit element disposed in a data input/output (I/O) path of the nonvolatile memory device;
a plurality of second repeaters connected to a second circuit element disposed in the data I/O path of the nonvolatile memory device, the second circuit element being spaced apart from the first circuit element; and
a plurality of signal lines configured to connect the plurality of first repeaters and the plurality of second repeaters, the plurality of signal lines including a first group of signal lines and a second group of signal lines which are alternatingly arranged, wherein the plurality of first repeaters include:
- a first group of repeaters that are activated in a first operation mode; and
- a second group of repeaters that are activated in a second operation mode having a non-overlapping operating interval with the first operation mode, wherein the plurality of second repeaters include:
- a third group of repeaters that are activated in the first operation mode and are connected to the first group of repeaters through the first group of signal lines; and
- a fourth group of repeaters that are activated in the second operation mode and are connected to the second group of repeaters through the second group of signal lines, wherein, in the second operation mode, the first group of repeaters are configured to float a first output node coupled to the first group of signal lines in response to a first power gating signal, and wherein, in the first operation mode, the second group of repeaters are configured to float a second output node coupled to the second group of signal lines in response to a second power gating signal.

* * * * *